United States Patent
Nagano et al.

(10) Patent No.: US 6,730,951 B2
(45) Date of Patent: May 4, 2004

(54) CAPACITOR, SEMICONDUCTOR MEMORY DEVICE, AND METHOD FOR MANUFACTURING THE SAME

(75) Inventors: Yoshihisa Nagano, Osaka (JP); Eiji Fujii, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/175,804

(22) Filed: Jun. 21, 2002

(65) Prior Publication Data

US 2002/0195633 A1 Dec. 26, 2002

(30) Foreign Application Priority Data

Jun. 25, 2001 (JP) .......................... 2001-191524

(51) Int. Cl.[7] .............................. H01L 27/108
(52) U.S. Cl. ............... 257/296; 257/297; 257/306; 257/311
(58) Field of Search .................. 257/296, 297, 257/303, 306, 309, 310, 311; 438/3, 240, 253

(56) References Cited

U.S. PATENT DOCUMENTS

| | | | | |
|---|---|---|---|---|
| 6,429,089 B1 | * | 8/2002 | Matsuki | 438/396 |
| 6,455,327 B1 | * | 9/2002 | Maejima | 438/3 |
| 6,458,604 B1 | * | 10/2002 | Yang | 438/3 |
| 6,509,601 B1 | * | 1/2003 | Lee et al. | 257/310 |
| 6,538,272 B2 | * | 3/2003 | Yamazaki et al. | 257/295 |
| 6,555,428 B2 | * | 4/2003 | Jung | 438/239 |
| 6,559,003 B2 | * | 5/2003 | Hartner et al. | 438/253 |
| 6,613,586 B2 | * | 9/2003 | Bailey | 438/3 |
| 2002/0142488 A1 | * | 10/2002 | Hong | 438/3 |

FOREIGN PATENT DOCUMENTS

| | | |
|---|---|---|
| JP | 11-008355 | 1/1999 |
| JP | 11-126881 | 5/1999 |
| JP | 2001-44376 | 2/2001 |
| JP | 2001-237393 | 8/2001 |

* cited by examiner

Primary Examiner—Tuan H. Nguyen
(74) Attorney, Agent, or Firm—McDermott, Will & Emery

(57) ABSTRACT

A capacitor includes: a lower electrode; a capacitor insulating film made of a metal oxide and formed on the lower electrode; an upper electrode formed on the capacitor insulating film; and a buried insulating film surrounding the lower electrode. The lower electrode includes a conductive barrier layer that prevents diffusion of oxygen, and an insulating barrier layer that prevents diffusion of hydrogen is formed so as to be in contact with at least a side surface of the conductive barrier layer in a side surface of the lower electrode.

19 Claims, 17 Drawing Sheets

US 6,730,951 B2

CAPACITOR, SEMICONDUCTOR MEMORY DEVICE, AND METHOD FOR MANUFACTURING THE SAME

BACKGROUND OF THE INVENTION

The present invention relates to a capacitor using a metal oxide in a capacitor insulating film, a semiconductor memory device using such a capacitor, and a method for manufacturing the same.

In recent years, along with developments in the digital technology for electronic equipment, the amount of data to be processed and stored has been increasing. Meanwhile, the level of functionality required for such electronic equipment has also been increasing, and the size of a semiconductor device used in electronic equipment and the size of a semiconductor element used in the semiconductor device have been rapidly reduced.

Along with this trend, techniques have been widely researched and developed in the art that allow the use of a high-permittivity dielectric material as a capacitor insulating film, instead of using silicon oxide or silicon nitride as in the prior art, in order to realize a higher degree of integration of a dynamic RAM device, for example.

Furthermore, ferroelectric films, which are spontaneously polarized, have been actively researched and developed in the art, aiming to realize a non-volatile RAM device that operates at a lower voltage than in the prior art and is capable of performing high-speed write and read operations. In a semiconductor memory device using such a high-permittivity dielectric material or a ferroelectric material in a capacitor insulating film, stacked memory cells have been used, instead of using planar memory cells as in the prior art, for highly-integrated memory devices whose storage capacity is on the order of megabits.

A conventional semiconductor memory device will now be described with reference to the drawings.

FIG. 15 is a cross-sectional view illustrating an important part of a conventional semiconductor memory device disclosed in Japanese Laid-Open Patent Publication No. 11-8355.

As illustrated in FIG. 15, the conventional semiconductor memory device includes a transistor 105, which includes source/drain regions 102 formed in an upper portion of a semiconductor substrate 101, and a gate electrode 104 formed over a channel region of the semiconductor substrate 101 via a gate insulating film 103. An interlayer insulating film 106 is formed on the semiconductor substrate 101 so as to cover the entire surface thereof including the transistor 105, and a contact plug 107 electrically connected to one of the source/drain regions 102 is formed in the interlayer insulating film 106.

An insulating hydrogen barrier layer 108 made of silicon nitride ($Si_3N_4$) is formed on the interlayer insulating film 106, and a conductive hydrogen barrier layer 109 made of titanium nitride (TiN) is formed on an upper end of the contact plug 107.

A lower electrode 110 containing iridium dioxide ($IrO_2$) or ruthenium dioxide ($RuO_2$) is formed on the insulating hydrogen barrier layer 108 so as to be connected to the conductive hydrogen barrier layer 109.

A buried insulating film 111 made of silicon oxide ($SiO_2$), silicon nitride ($Si_3N_4$), silicon oxynitride (SiON), etc., is formed on the insulating hydrogen barrier layer 108 between the lower electrodes 110.

A capacitor insulating film 112 made of a ferroelectric material such as lead zirconate titanate ($Pb(Zr, Ti)O_3$) or strontium bismuth tantalate ($SrBi_2Ta_2O_9$) is formed on the buried insulating film 111 including the lower electrode 110, and an upper electrode 113 containing iridium dioxide or ruthenium dioxide is formed on the capacitor insulating film 112. Moreover, an insulating hydrogen barrier layer 114 made of silicon nitride, etc., is formed on the upper electrode 113.

However, the conventional semiconductor memory device as described above has two problems as follows.

First, the conductive oxide film of the lower electrode 110, which is made of iridium dioxide or ruthenium dioxide and serves as a barrier against oxygen, is reduced by hydrogen that is generated during the manufacturing process, whereby the barrier property thereof against oxygen is deteriorated.

Second, the high-permittivity dielectric material or the ferroelectric material of the capacitor insulating film 112 is reduced by hydrogen that is generated during the manufacturing process, whereby the electrical characteristics thereof as a capacitor are deteriorated.

The first problem, i.e., the reduction of the lower electrode having an oxygen barrier property during the manufacturing process, will first be described with reference to FIG. 16A and FIG. 16B.

As illustrated in FIG. 16A, when a buried insulating film 111A is deposited after patterning the lower electrode 110 containing iridium dioxide or ruthenium dioxide, hydrogen ions are generated from monosilane ($SiH_4$) or ammonia ($NH_3$), which is a material gas, and iridium dioxide or ruthenium dioxide is easily reduced by the hydrogen ions. The reduction reaction is particularly pronounced in a case where a plasma CVD method is used for depositing the buried insulating film 111A.

As a result, the diffusion barrier property against oxygen atoms in the buried insulating film 111 is deteriorated. Therefore, during an oxygen annealing process performed at about 650° C. to 800° C., which is necessary for crystallization of the capacitor insulating film 112, which is made of a high-permittivity dielectric material or a ferroelectric material and formed on the lower electrode 110, oxygen ions diffused from the capacitor insulating film 112 are diffused through the lower electrode 110 to reach the interface between the lower electrode 110 and the contact plug 107, as illustrated in FIG. 16B. This causes a contact failure, e.g., an increase in the contact resistance.

Next, the second problem, i.e., the reduction of the capacitor insulating film made of a high-permittivity dielectric material or a ferroelectric material during the manufacturing process, will be described with reference to FIG. 17.

In an actual semiconductor memory device, a plurality of capacitors and transistors are both arranged two-dimensionally in a so-called "array pattern", as illustrated in FIG. 15 or FIG. 17. In a case where the capacitor insulating film 112 of the capacitors, which are arranged in an array pattern, is made of a high-permittivity dielectric material or a ferroelectric material, a metal oxide is used in many cases, as described above. Therefore, it is not possible to prevent some of the capacitors arranged in an array pattern that are located along a periphery 100 of the array pattern from being reduced by hydrogen ions, only with the insulating hydrogen barrier layer 108 provided under the capacitors and the insulating hydrogen barrier layer 114 provided over the capacitors, for the following reason. As illustrated in FIG. 17, although the diffusion of hydrogen ions into the capacitors in the upward direction and the downward direction of the semiconductor substrate 101 can be prevented, it is not possible to prevent the diffusion of hydrogen ions in a lateral direction, i.e., in a direction parallel to the substrate plane, into those capacitors that are located along the periphery 100.

Japanese Laid-Open Patent Publication No. 2001-237393 discloses a semiconductor memory device in which a capacitor is covered completely with a hydrogen barrier layer. However, in a semiconductor memory device in which a plurality of capacitors are arranged in a two-dimensional array pattern, the deterioration of the characteristics of the capacitors cannot be prevented unless all of the plurality of capacitors are covered completely with the hydrogen barrier layer.

Moreover, Japanese Laid-Open Patent Publication No. 11-126881 discloses a semiconductor memory device in which a plurality of capacitors are covered completely with a hydrogen barrier layer. However, this publication does not disclose means for applying a voltage to an upper electrode 110 shown in FIG. 1 of the publication. Assuming that a contact hole is provided for the application of a voltage to the upper electrode 110, a hydrogen barrier layer 111 covering the upper electrode 110 needs to be etched. If such an etching process is performed for making an opening in the hydrogen barrier layer 111, the capacitors are deteriorated by hydrogen that is generated during a resist ashing process, which is performed after the opening is made, or by hydrogen that is generated during the subsequent wiring steps (i.e., a series of processes, including filling the contact hole with a plug, depositing and patterning a wiring layer, sintering the obtained wires using a hydrogen gas, and forming an insulating film that fills the space between the wires), as stated in Japanese Laid-Open Patent Publication No. 2001-44376.

As described above, in the conventional semiconductor memory device, it is difficult to completely cover the memory cell array, including a plurality of capacitors arranged in an array pattern, with a hydrogen barrier layer.

SUMMARY OF THE INVENTION

The present invention has been made to solve these problems in the prior art, and a first object thereof is to make it possible to maintain the oxygen barrier property of a lower electrode in a capacitor, a second object thereof is to make it possible to prevent a capacitor insulating film of a capacitor made of a metal oxide from being reduced, and a third object thereof is to make it possible to reliably prevent the characteristics of a capacitor from being deteriorated in a case where a memory cell array is divided into blocks, and the memory cell array is covered for every one or more blocks.

In order to achieve the first object, the present invention employs a structure in which the side surface of the lower electrode of a capacitor is covered with a first insulating barrier layer that prevents the diffusion of oxygen and hydrogen. In order to achieve the second object, the present invention employs a structure in which the side surface of the capacitor insulating film of a capacitor is covered with a second insulating barrier layer that prevents the diffusion of hydrogen. In order to achieve the third object, the present invention employs a structure in which a memory cell array is divided into blocks, and capacitors are covered, for every one or more blocks, with an insulating barrier layer that prevents the diffusion of hydrogen.

Specifically, a first capacitor of the present invention, which achieves the first object set forth above, includes: a lower electrode; a capacitor insulating film made of a metal oxide and formed on the lower electrode; an upper electrode formed on the capacitor insulating film; and a buried insulating film surrounding the lower electrode, wherein: the lower electrode includes a conductive barrier layer that prevents diffusion of oxygen; and an insulating barrier layer that prevents diffusion of hydrogen is formed so as to be in contact with at least a side surface of the conductive barrier layer in a side surface of the lower electrode.

With the first capacitor, hydrogen that is generated during the deposition of the buried insulating film surrounding the lower electrode is prevented from being diffused into the lower electrode by the insulating barrier layer formed on the side surface of the lower electrode. As a result, in a case where the conductive barrier layer of the lower electrode that prevents diffusion of oxygen is made of a metal oxide, for example, the conductive barrier layer is prevented from being reduced by hydrogen, whereby the conductive barrier layer can maintain its barrier property against oxygen.

In the first capacitor, it is preferred that the buried insulating film is formed in a hydrogen-containing atmosphere.

In the first capacitor, it is preferred that the buried insulating film is made of silicon oxide ($SiO_2$) or silicon nitride ($Si_3N_4$).

In the first capacitor, it is preferred that the insulating barrier layer also prevents diffusion of oxygen.

In the first capacitor, it is preferred that the conductive barrier layer includes a layered film made of a first conductive barrier layer that prevents diffusion of oxygen and hydrogen, and a second conductive barrier layer that prevents diffusion of oxygen.

In such a case, it is preferred that the first conductive barrier layer includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl).

Moreover, in such a case, it is preferred that the second conductive barrier layer includes one of, or is a layered film including at least two of, iridium dioxide ($IrO_2$), a layered film including a lower layer made of iridium (Ir) and an upper layer made of iridium dioxide ($IrO_2$), ruthenium dioxide ($RuO_2$), and a layered film including a lower layer made of ruthenium (Ru) and an upper layer made of ruthenium dioxide ($RuO_2$).

In the first capacitor, it is preferred that the insulating barrier layer includes one of aluminum oxide ($Al_2O_3$), titanium aluminum oxide (TiAlO), and tantalum aluminum oxide (TaAlO).

A second capacitor of the present invention, which achieves the first object set forth above, includes: a lower electrode; a capacitor insulating film made of a metal oxide and formed on the lower electrode; an upper electrode formed on the capacitor insulating film; and a buried insulating film surrounding the lower electrode, wherein: the lower electrode includes a conductive barrier layer that includes one of, or is a layered film including at least two of, iridium dioxide ($IrO_2$), a layered film including a lower layer made of iridium (Ir) and an upper layer made of iridium dioxide ($IrO_2$), ruthenium dioxide ($RuO_2$), and a layered film including a lower layer made of ruthenium (Ru) and an upper layer made of ruthenium dioxide ($RuO_2$); and an insulating barrier layer including at least one of aluminum oxide ($Al_2O_3$), titanium aluminum oxide (TiAlO), and tantalum aluminum oxide (TaAlO), is formed so as to be in contact with at least a side surface of the conductive barrier layer in a side surface of the lower electrode.

With the second capacitor, hydrogen that is generated during the deposition of the buried insulating film is prevented from being diffused into the lower electrode by the insulating barrier layer formed on the side surface of the lower electrode. As a result, the conductive barrier layer is prevented from being reduced by hydrogen, whereby the conductive barrier layer can maintain its barrier property against oxygen.

A first semiconductor memory device of the present invention, which achieves the first object set forth above, includes: a transistor formed on a semiconductor substrate and including a source region and a drain region; an interlayer insulating film formed on the semiconductor substrate so as to cover the transistor; a contact plug formed in the interlayer insulating film so as to be electrically connected to the source region or the drain region of the transistor; and the first or second capacitor of the present invention in which the lower electrode is formed on the contact plug.

The first semiconductor memory device includes the first or second capacitor of the present invention, whereby hydrogen that is generated during the deposition of the buried insulating film is prevented from being diffused into the lower electrode by the insulating barrier layer formed on the side surface of the lower electrode. As a result, in a case where the conductive barrier layer of the lower electrode that prevents diffusion of oxygen is made of a metal oxide, for example, the conductive barrier layer is prevented from being reduced by hydrogen, thereby preventing the deterioration of the characteristics of the capacitor.

A first method for manufacturing a semiconductor memory device of the present invention, which achieves the first object set forth above, includes: a first step of forming a gate electrode on a semiconductor substrate, and then forming a source region and a drain region in the semiconductor substrate on opposite sides of the gate electrode, thereby forming a transistor; a second step of forming an interlayer insulating film on the semiconductor substrate including the transistor; a third step of forming a contact plug in the interlayer insulating film so as to be electrically connected to the source region or the drain region; a fourth step of forming a first conductive film on the interlayer insulating film, the first conductive film including a conductive barrier layer that prevents diffusion of oxygen; a fifth step of patterning the first conductive film so as to be electrically connected to the contact plug, thereby forming a lower electrode from the first conductive film on the interlayer insulating film; a sixth step of forming an insulating barrier layer that prevents diffusion of hydrogen on the interlayer insulating film so as to cover an upper surface and a side surface of the lower electrode; a seventh step of forming a first insulating film on the insulating barrier layer, and then flattening the first insulating film and the insulating barrier layer so that the lower electrode is exposed; an eighth step of forming a second insulating film made of a metal oxide on the first insulating film and the insulating barrier layer, which have been flattened, including the exposed upper surface of the lower electrode, and forming a second conductive film on the second insulating film; and a ninth step of patterning the second conductive film, the second insulating film and the first insulating film so that a remaining portion extends over the lower electrode, thereby forming, on the lower electrode, an upper electrode from the second conductive film and a capacitor insulating film from the second insulating film, and forming a buried insulating film from the first insulating film, the buried insulating film surrounding the lower electrode.

With the first method for manufacturing a semiconductor memory device, in a case where the conductive barrier layer of the lower electrode that prevents diffusion of oxygen is made of a metal oxide, the conductive barrier layer is prevented from being reduced by hydrogen, whereby the conductive barrier layer can maintain its barrier property against oxygen.

In the first method for manufacturing a semiconductor memory device, it is preferred that the buried insulating film is formed in a hydrogen-containing atmosphere.

In the first method for manufacturing a semiconductor memory device, it is preferred that the fourth step includes a step of forming a first conductive barrier layer that prevents diffusion of oxygen and hydrogen, and a step of forming a second conductive barrier layer that prevents diffusion of oxygen.

A third capacitor of the present invention, which achieves the second object set forth above, includes: a lower electrode; a capacitor insulating film made of a metal oxide and formed on the lower electrode; an upper electrode formed on the capacitor insulating film; and a buried insulating film surrounding the lower electrode, wherein: the lower electrode includes a conductive barrier layer that prevents diffusion of oxygen and hydrogen; a first insulating barrier layer that prevents diffusion of hydrogen is formed so as to be in contact with at least a side surface of the conductive barrier layer in a side surface of the lower electrode; a second insulating barrier layer that prevents diffusion of hydrogen is formed so as to cover an upper surface and a side surface of the upper electrode and a side surface of the capacitor insulating film; and the second insulating barrier layer covers the lower electrode and is in contact with the first insulating barrier layer.

With the third capacitor, hydrogen that is generated during the manufacturing process is not diffused into the capacitor insulating film through the side surface thereof, whereby the metal oxide is not reduced. In addition, the capacitor is covered with the second insulating barrier layer with no gap, whereby the capacitor is prevented from being reduced by hydrogen. As a result, it is possible to obtain a capacitor having predetermined electrical characteristics.

In the third capacitor, it is preferred that the buried insulating film is formed in a hydrogen-containing atmosphere.

In the third capacitor, it is preferred that the buried insulating film is made of silicon oxide ($SiO_2$) or silicon nitride ($Si_3N_4$).

In the third capacitor, it is preferred that the first insulating barrier layer also prevents diffusion of oxygen.

In the third capacitor, it is preferred that the conductive barrier layer includes a layered film made of a first conductive barrier layer that prevents diffusion of oxygen and hydrogen, and a second conductive barrier layer that prevents diffusion of oxygen.

In such a case, it is preferred that the first conductive barrier layer includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl).

Moreover, in such a case, it is preferred that the second conductive barrier layer includes one of, or is a layered film including at least two of, iridium dioxide ($IrO_2$), a layered film including a lower layer made of iridium (Ir) and an upper layer made of iridium dioxide ($IrO_2$), ruthenium dioxide (RuO$_2$), and a layered film including a lower layer made of ruthenium (Ru) and an upper layer made of ruthenium dioxide (RuO$_2$).

In the third capacitor, it is preferred that the first insulating barrier layer and the second insulating barrier layer are made of aluminum oxide (Al$_2$O$_3$), titanium aluminum oxide (TiAlO), or tantalum aluminum oxide (TaAlO).

A fourth capacitor of the present invention, which achieves the second object set forth above, includes: a lower electrode; a capacitor insulating film made of a metal oxide and formed on the lower electrode; an upper electrode formed on the capacitor insulating film; and a buried insulating film surrounding the lower electrode, wherein: the lower electrode includes a conductive barrier layer that includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl); a first insulating barrier layer including at least one of aluminum oxide (Al$_2$O$_3$), titanium aluminum oxide (TiAlO), and tantalum aluminum oxide (TaAlO), is formed so as to be in contact with at least a side surface of the conductive barrier layer in a side surface of the lower electrode; a second insulating barrier layer including at least one of aluminum oxide (Al$_2$O$_3$), titanium aluminum oxide (TiAlO), and tantalum aluminum oxide (TaAlO), is formed so as to cover an upper surface and a side surface of the upper electrode and a side surface of the capacitor insulating film; and the second insulating barrier layer covers the lower electrode and is in contact with the first insulating barrier layer.

With the fourth capacitor, the second insulating barrier layer, which is made of one material selected from the same group of materials as that for the first insulating barrier layer, is formed so as to cover the upper surface and the side surface of the upper electrode, the side surface of the capacitor insulating film and the lower electrode and to be in contact with the first insulating barrier layer. Thus, the capacitor is covered with the second insulating barrier layer with no gap, whereby the capacitor is prevented from being reduced by hydrogen.

A second semiconductor memory device of the present invention includes: a transistor formed on a semiconductor substrate and including a source region and a drain region; an interlayer insulating film formed on the semiconductor substrate so as to cover the transistor; a contact plug formed in the interlayer insulating film so as to be electrically connected to the source region or the drain region of the transistor; and the third or fourth capacitor of the present invention in which the lower electrode is formed on the contact plug.

The second semiconductor memory device includes the third or fourth capacitor of the present invention, whereby hydrogen that is generated during the deposition of the buried insulating film is prevented from being diffused into the lower electrode by the insulating barrier layer formed on the side surface of the lower electrode. Furthermore, hydrogen that is generated during the manufacturing process is not diffused into the capacitor insulating film through the side surface thereof, whereby the metal oxide is not reduced. In addition, the capacitor is covered with the second insulating barrier layer with no gap, whereby the capacitor is prevented from being reduced by hydrogen.

A second method for manufacturing a semiconductor memory device of the present invention includes: a first step of forming a gate electrode on a semiconductor substrate, and then forming a source region and a drain region in the semiconductor substrate on opposite sides of the gate electrode, thereby forming a transistor; a second step of forming an interlayer insulating film on the semiconductor substrate including the transistor; a third step of forming a contact plug in the interlayer insulating film so as to be electrically connected to the source region or the drain region; a fourth step of forming a first conductive film on the interlayer insulating film, the first conductive film including a conductive barrier layer that prevents diffusion of oxygen and hydrogen; a fifth step of patterning the first conductive film so as to be electrically connected to the contact plug, thereby forming a lower electrode from the first conductive film on the interlayer insulating film; a sixth step of forming a first insulating barrier layer that prevents diffusion of hydrogen on the interlayer insulating film so as to cover an upper surface and a side surface of the lower electrode; a seventh step of forming a first insulating film on the first insulating barrier layer, and then flattening the first insulating film and the first insulating barrier layer so that the lower electrode is exposed; an eighth step of forming a second insulating film made of a metal oxide on the first insulating film and the first insulating barrier layer, which have been flattened, including the exposed upper surface of the lower electrode, and forming a second conductive film on the second insulating film; a ninth step of patterning the second conductive film, the second insulating film and the first insulating film so that a remaining portion extends over the lower electrode, thereby forming, on the lower electrode, an upper electrode from the second conductive film and a capacitor insulating film from the second insulating film, and forming a buried insulating film from the first insulating film, the buried insulating film surrounding the lower electrode; and a tenth step of forming a second insulating barrier layer that prevents diffusion of hydrogen so as to cover the upper electrode, the capacitor insulating film and the buried insulating film and to be in contact with the first insulating barrier layer beside the lower electrode.

With the second method for manufacturing a semiconductor memory device, it is possible to prevent the capacitor insulating film made of a metal oxide of the capacitor from being reduced during the manufacturing process, in addition to the effects of the first method for manufacturing a semiconductor memory device as described above.

In the second method for manufacturing a semiconductor memory device, it is preferred that the first insulating film is formed in a hydrogen-containing atmosphere.

In the second method for manufacturing a semiconductor memory device, it is preferred that the ninth step includes a step of, after the patterning of the first insulating film, patterning the first insulating barrier layer into substantially the same shape as the patterned first insulating film.

In the second method for manufacturing a semiconductor memory device, it is preferred that the fourth step includes a step of forming a first conductive barrier layer that prevents diffusion of oxygen and hydrogen, and a step of forming a second conductive barrier layer that prevents diffusion of oxygen.

A third semiconductor memory device of the present invention, which achieves the third object set forth above, includes: a first transistor formed on a semiconductor substrate and including a source region and a drain region; an interlayer insulating film formed on the semiconductor substrate so as to cover the first transistor; a first contact plug formed in the interlayer insulating film so as to be electrically connected to the source region or the drain region of the first transistor; a lower electrode formed on the interlayer insulating film so as to be electrically connected to the first contact plug, the lower electrode including a conductive barrier layer that prevents diffusion of hydrogen; a capacitor insulating film made of a metal oxide and formed on the lower electrode; and a memory cell array including an upper electrode formed on the capacitor insulating film, the upper electrode being provided for one or more blocks each including a plurality of lower electrodes, wherein an insulating barrier layer that prevents diffusion of hydrogen is formed so as to cover a periphery of one or more of the blocks.

With the third semiconductor memory device, the insulating barrier layer that prevents diffusion of hydrogen is formed so as to cover the periphery of one or more blocks of the memory cell array, whereby it is possible to reliably prevent the deterioration of the characteristics of the capacitor.

It is preferred that in the block of the third semiconductor memory device, the upper electrode is electrically connected to a second contact plug, which is connected to a source region or a drain region of a second transistor, via a conductive barrier film that prevents diffusion of hydrogen.

It is preferred that in the block of the third semiconductor memory device, the upper electrode is electrically connected to a second contact plug, which is connected to a source region or a drain region of a second transistor, via the lower electrode.

A fourth semiconductor memory device of the present invention, which achieves the third object set forth above, includes: a first transistor formed on a semiconductor substrate and including a source region and a drain region; an interlayer insulating film formed on the semiconductor substrate so as to cover the first transistor; a first contact plug formed in the interlayer insulating film so as to be electrically connected to the source region or the drain region of the first transistor; a lower electrode formed on the interlayer insulating film so as to be electrically connected to the first contact plug, the lower electrode including a conductive barrier layer that prevents diffusion of hydrogen; a capacitor insulating film made of a metal oxide and formed on the lower electrode; and a memory cell array including an upper electrode formed on the capacitor insulating film, the upper electrode being provided for one or more blocks each including a plurality of lower electrodes, wherein: a first insulating barrier layer that prevents diffusion of hydrogen is formed so as to be in contact with the plurality of lower electrodes and to cover a bottom surface of the block; a second insulating barrier layer that prevents diffusion of hydrogen is formed so as to cover an upper surface and a side surface of the upper electrode and a side surface of the capacitor insulating film, thereby covering an upper surface and a side surface of the block; and the second insulating barrier layer is in contact with the first insulating barrier layer along a periphery of one or more of the blocks.

With the fourth semiconductor memory device, the first insulating barrier layer that prevents diffusion of hydrogen is formed so as to be in contact with the plurality of lower electrodes and to cover the bottom surface of the block, in addition to the effects of the third semiconductor memory device as described above, whereby it is possible to more reliably prevent the deterioration of the characteristics of the capacitor.

In the fourth semiconductor memory device, it is preferred that the conductive barrier layer includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl).

In the fourth semiconductor memory device, it is preferred that the first insulating barrier layer or the second insulating barrier layer includes at least one of aluminum oxide ($Al_2O_3$), titanium aluminum oxide (TiAlO), and tantalum aluminum oxide (TaAlO).

In the fourth semiconductor memory device, it is preferred that the first insulating barrier layer is made of silicon nitride ($Si_3N_4$).

A third method for manufacturing a semiconductor memory device of the present invention includes: a first step of forming a gate electrode on a semiconductor substrate, and then forming a source region and a drain region in the semiconductor substrate on opposite sides of the gate electrode, thereby forming a transistor; a second step of forming an interlayer insulating film on the semiconductor substrate including the transistor; a third step of forming a contact plug in the interlayer insulating film so as to be electrically connected to the source region or the drain region; a fourth step of forming a first conductive film on the interlayer insulating film, the first conductive film including a conductive barrier layer that prevents diffusion of oxygen and hydrogen; a fifth step of patterning the first conductive film so as to be electrically connected to the contact plug, thereby forming a plurality of lower electrodes from the first conductive film on the interlayer insulating film; a sixth step of forming a first insulating barrier layer that prevents diffusion of hydrogen on the interlayer insulating film so as to cover an upper surface and a side surface of the plurality of lower electrodes; a seventh step of forming a first insulating film on the first insulating barrier layer, and then flattening the first insulating film and the first insulating barrier layer so that the plurality of lower electrodes are exposed; an eighth step of forming a second insulating film made of a metal oxide entirely across an upper surface of the first insulating film and the first insulating barrier layer, which have been flattened, including an upper surface of the exposed lower electrodes; a ninth step of forming a second conductive film on the second insulating film; a tenth step of patterning the second conductive film, the second insulating film and the first insulating film so that a remaining portion extends over a block including the plurality of lower electrodes, thereby forming an upper electrode from the second conductive film so as to cover the block, forming a capacitor insulating film from the second insulating film, and forming a buried insulating film from the first insulating film, the buried insulating film filling a space between the plurality of lower electrodes; and an eleventh step of forming a second insulating barrier layer that prevents diffusion of hydrogen so as to cover the upper electrode, the capacitor insulating film and the buried insulating film in the block and to be in contact with the first insulating barrier layer along a periphery of the block.

With the third method for manufacturing a semiconductor memory device, the second insulating barrier layer is formed so as to cover the upper electrode, the capacitor insulating film and the buried insulating film in the block and to be in contact with the first insulating barrier layer along the periphery of the block, whereby it is possible to prevent the characteristics of the capacitor from being deteriorated during the manufacturing process.

A fourth method for manufacturing a semiconductor memory device of the present invention includes: a first step of forming gate electrodes on a semiconductor substrate, and then forming source regions and drain regions in the semiconductor substrate on opposite sides of the gate electrodes, thereby forming a first transistor and a second transistor; a second step of forming an interlayer insulating film on the semiconductor substrate including the first transistor and the second transistor; a third step of forming a first contact plug and a second contact plug in the interlayer insulating film so as to be electrically connected to the source region or the drain region of the first transistor and the second transistor, respectively; a fourth step of forming a first conductive film on the interlayer insulating film, the first conductive film including a conductive barrier layer that prevents diffusion of oxygen and hydrogen; a fifth step of patterning the first conductive film so as to be electrically connected to the first contact plug and the second contact plug, thereby forming a plurality of lower electrodes from the first conductive film on the interlayer insulating film; a sixth step of forming a first insulating barrier layer that prevents diffusion of hydrogen on the interlayer insulating film so as to cover an upper surface and a side surface of the plurality of lower electrodes; a seventh step of forming a first insulating film on the first insulating barrier layer, and then flattening the first insulating film and the first insulating barrier layer so that the plurality of lower electrodes are exposed; an eighth step of forming a second insulating film made of a metal oxide entirely across an upper surface of the first insulating film and the first insulating barrier layer, which have been flattened, including an upper surface of the exposed lower electrodes; a ninth step of removing a portion of the second insulating film over the lower electrode that is connected to the second contact plug in a block including the plurality of lower electrodes; a tenth step of forming a second conductive film on the second insulating film and on the lower electrode that is connected to the second contact plug; an eleventh step of patterning the second conductive film, the second insulating film and the first insulating film so that a remaining portion extends over the block, thereby forming an upper electrode from the second conductive film so as to cover the block, forming a capacitor insulating film from the second insulating film, and forming a buried insulating film from the first insulating film, the buried insulating film filling a space between the plurality of lower electrodes; and a twelfth step of forming a second insulating barrier layer that prevents diffusion of hydrogen so as to cover the upper electrode, the capacitor insulating film and the buried insulating film in the block and to be in contact with the first insulating barrier layer along a periphery of the block.

With the fourth method for manufacturing a semiconductor memory device, a voltage can be applied to the upper electrode from the second transistor through the second contact plug without making an opening in the second insulating barrier layer, in addition to the effects of the third method for manufacturing a semiconductor memory device as described above. As a result, it is no longer necessary to provide an opening and wiring in the second insulating barrier layer covering the upper electrode, and thus the exposure to hydrogen is eliminated, whereby it is possible to prevent the deterioration of the characteristics of the capacitor.

A fifth method for manufacturing a semiconductor memory device of the present invention includes: a first step of forming a gate electrode on a semiconductor substrate, and then forming a source region and a drain region in the semiconductor substrate on opposite sides of the gate electrode, thereby forming a transistor; a second step of forming an interlayer insulating film on the semiconductor substrate including the transistor; a third step of forming a first insulating barrier layer that prevents diffusion of hydrogen on the interlayer insulating film; a fourth step of forming a contact plug in the interlayer insulating film and the first insulating barrier layer so as to be electrically connected to the source region or the drain region; a fifth step of forming a first conductive film on the first insulating barrier layer, the first conductive film including a conductive barrier layer that prevents diffusion of hydrogen; a sixth step of patterning the first conductive film so as to be electrically connected to the contact plug, thereby forming a plurality of lower electrodes from the first conductive film on the first insulating barrier layer; a seventh step of forming a first insulating film on the first insulating barrier layer including an upper surface of the plurality of lower electrodes, and then flattening the first insulating film so that the plurality of lower electrodes are exposed; an eighth step of forming a second insulating film made of a metal oxide entirely across an upper surface of the first insulating film, which has been flattened, including an upper surface of the exposed lower electrodes; a ninth step of forming a second conductive film on the second insulating film; a tenth step of patterning the second conductive film, the second insulating film and the first insulating film so that a remaining portion extends over a block including the plurality of lower electrodes, thereby forming an upper electrode from the second conductive film so as to cover the block, forming a capacitor insulating film from the second insulating film, and forming a buried insulating film from the first insulating film, the buried insulating film filling a space between the plurality of lower electrodes; and an eleventh step of forming a second insulating barrier layer that prevents diffusion of hydrogen so as to cover the upper electrode, the capacitor insulating film and the buried insulating film in the block and to be in contact with the first insulating barrier layer along a periphery of the block.

With the fifth method for manufacturing a semiconductor memory device, the second insulating barrier layer is formed so as to cover the upper electrode, the capacitor insulating film and the buried insulating film in the block and to be in contact with the first insulating barrier layer along the periphery of the block, whereby it is possible to prevent the characteristics of the capacitor from being deteriorated during the manufacturing process.

A sixth method for manufacturing a semiconductor memory device of the present invention includes: a first step of forming gate electrodes on a semiconductor substrate, and then forming source regions and drain regions in the semiconductor substrate on opposite sides of the gate electrodes, thereby forming a first transistor and a second transistor; a second step of forming an interlayer insulating film on the semiconductor substrate including the first transistor and the second transistor; a third step of forming a first insulating barrier layer that prevents diffusion of hydrogen on the interlayer insulating film; a fourth step of forming a first contact plug and a second contact plug in the interlayer insulating film and the first insulating barrier layer so as to be electrically connected to the source region or the drain region of the first transistor and the second transistor, respectively; a fifth step of forming a first conductive film on the first insulating barrier layer, the first conductive film including a conductive barrier layer that prevents diffusion of hydrogen; a sixth step of patterning the first conductive film so as to be electrically connected to the first contact plug and the second contact plug, thereby forming a plurality of lower electrodes from the first conductive film on the first insulating barrier layer; a seventh step of forming a first insulating film on the first insulating barrier layer including an upper surface of the plurality of lower electrodes, and then flattening the first insulating film so that the plurality of lower electrodes are exposed; an eighth step of forming a second insulating film made of a metal oxide entirely across an upper surface of the first insulating film, which has been flattened, including an upper surface of the exposed lower electrodes; a ninth step of removing a portion of the second insulating film over the lower electrode that is connected to the second contact plug in a block including the plurality of lower electrodes; a tenth step of forming a second conductive film on the second insulating film and on the lower electrode that is connected to the second contact plug; an eleventh step of patterning the second conductive film, the second insulating film and the first insulating film so that a remaining portion extends over the block, thereby forming an upper electrode from the second conductive film so as to cover the block, forming a capacitor insulating film from the second insulating film, and forming a buried insulating film from the first insulating film, the buried insulating film filling a space between the plurality of lower electrodes; and a twelfth step of forming a second insulating barrier layer that prevents diffusion of hydrogen so as to cover the upper electrode, the capacitor insulating film and the buried insulating film in the block and to be in contact with the first insulating barrier layer along a periphery of the block.

With the sixth method for manufacturing a semiconductor memory device, a voltage can be applied to the upper electrode from the second transistor through the second contact plug without making an opening in the second insulating barrier layer, in addition to the effects of the fifth method for manufacturing a semiconductor memory device as described above. As a result, it is no longer necessary to provide an opening and wiring in the second insulating barrier layer covering the upper electrode, and thus the exposure to hydrogen is eliminated, whereby it is possible to prevent the deterioration of the characteristics of the capacitor.

In the third or fifth method for manufacturing a semiconductor memory device, it is preferred that the tenth step includes a step of, after the patterning of the first insulating film, patterning the first insulating barrier layer into substantially the same shape as the patterned first insulating film.

In the fourth or sixth method for manufacturing a semiconductor memory device, it is preferred that the eleventh step includes a step of, after the patterning of the first insulating film, patterning the first insulating barrier layer into substantially the same shape as the patterned first insulating film.

BRIEF DESCRIPTION OF THE DRAWINGS

FIG. 6A to FIG. 6C are cross-sectional views each illustrating a lower electrode and a first insulating barrier layer covering the side surface of the lower electrode with other elements therearound according to a variation of the first embodiment of the present invention, wherein FIG. 6A shows the first variation, FIG. 6B shows the second variation, and FIG. 6C shows the third variation.

FIG. 9A to FIG. 9C illustrate an important part of a semiconductor memory device according to the third embodiment of the present invention, wherein FIG. 9A is a plan view illustrating cell blocks forming a memory cell array, FIG. 9B is a cross-sectional view taken along line IXb—IXb of FIG. 9A, and FIG. 9C is a cross-sectional view taken along line IXc—IXc of FIG. 9A.

FIG. 12A to FIG. 12C illustrate an important part of a semiconductor memory device according to the fourth embodiment of the present invention, wherein FIG. 12A is a plan view illustrating cell blocks forming a memory cell array, FIG. 12B is a cross-sectional view taken along line XIIb—XIIb of FIG. 12A, and FIG. 12C is a cross-sectional view taken along line XIIc—XIIc of FIG. 12A.

DETAILED DESCRIPTION OF THE INVENTION

First Embodiment

The first embodiment of the present invention will now be described with reference to the drawings.

Figure 1A:
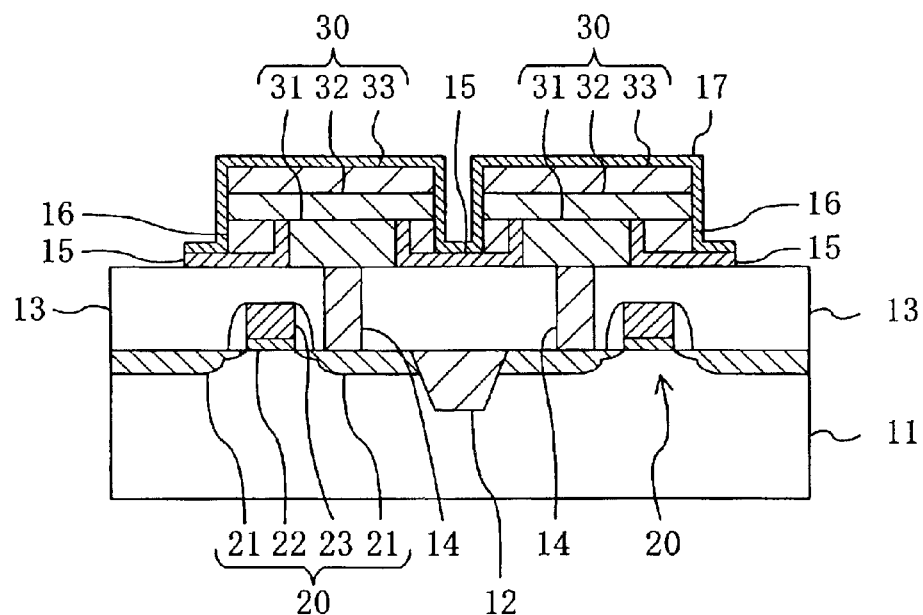
FIG. 1A is a cross-sectional view illustrating an important part of a semiconductor memory device including a capacitor according to the first embodiment of the present invention.

FIG. 1A is a cross-sectional view illustrating an important part of a semiconductor memory device including a capacitor according to the first embodiment of the present invention.

As illustrated in FIG. 1A, the semiconductor memory device of the first embodiment includes a plurality of cell transistors 20, which are MOSFETs formed on a semiconductor substrate 11 made of silicon (Si), for example, and a capacitor 30 formed, for each of the cell transistors 20, on an interlayer insulating film 13 covering the cell transistors 20. The cell transistors 20 are partitioned and insulated from one another by a shallow trench isolation (STI) 12 formed in an upper portion of the semiconductor substrate 11.

Each cell transistor 20 includes source/drain regions 21 formed in an upper portion of the semiconductor substrate 11, and a gate electrode 23 formed over a channel region of the semiconductor substrate 11 via a gate insulating film 22.

Each capacitor 30 includes a lower electrode 31, a capacitor insulating film 32, and an upper electrode 33, which are deposited in this order starting from the substrate side.

Figure 1B:
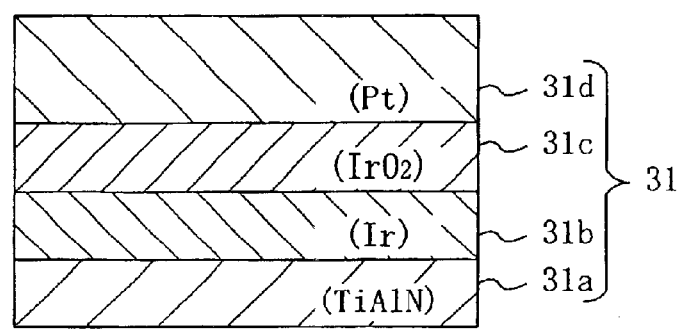
FIG. 1B is a cross-sectional view illustrating a lower electrode of the capacitor according to the first embodiment of the present invention.

As illustrated in FIG. 1B, the lower electrode 31 is made of a layered film that includes a first conductive barrier layer 31a, a second conductive barrier layer 31b, a third conductive barrier layer 31c, and a conductive layer 31d. The first conductive barrier layer 31a is made of titanium aluminum nitride (TiAlN), has a thickness of about 40 nm to 100 nm, and prevents the diffusion of oxygen and hydrogen. The second conductive barrier layer 31b is made of iridium (Ir), has a thickness of about 50 nm to 100 nm, and prevents the diffusion of oxygen. The third conductive barrier layer 31c is made of iridium dioxide (IrO$_2$), has a thickness of about 50 nm to 100 nm, and prevents the diffusion of oxygen. The conductive layer 31d is made of platinum (Pt) and has a thickness of about 50 nm to 100 nm.

The capacitor insulating film 32 is made of strontium bismuth tantalum niobate (SrBi$_2$(Ta$_{1-x}$Nb$_x$)$_2$O$_9$) (where x satisfies $0 \leq x \leq 1$) having a bismuth layered perovskite structure with a thickness of about 50 nm to 150 nm. The upper electrode 33 is made of platinum and has a thickness of about 50 nm to 100 nm.

As illustrated in FIG. 1A, the interlayer insulating film 13 made of silicon oxide (SiO$_2$), for example, is formed on the semiconductor substrate 11 so as to cover the cell transistors 20. A plurality of contact plugs 14 made of tungsten (W) or polysilicon are formed in the interlayer insulating film 13. The lower end of each of the contact plugs 14 is electrically connected to one of the source/drain regions 21, and the upper end thereof is electrically connected to the lower electrode 31.

The side surface of the lower electrode 31 and a region of the upper surface of the interlayer insulating film 13 beside the lower electrode 31 are covered with a first insulating barrier layer 15. For example, the first insulating barrier layer 15 is made of aluminum oxide (Al$_2$O$_3$), has a thickness of about 5 nm to 100 nm, and prevents the diffusion of oxygen and hydrogen.

Herein, the diameter of the lower electrode 31 in the direction of the substrate plane is smaller than that of the capacitor insulating film 32 and the upper electrode 33. Therefore, the peripheral portion of the capacitor insulating film 32 and the upper electrode 33 protrudes beyond the peripheral portion of the lower electrode 31.

The region beside the lower electrode 31 and under the protruding portion of the capacitor insulating film 32 is filled with a buried insulating film 16 made of silicon oxide (SiO$_2$) or silicon nitride (Si$_3$N$_4$).

The buried insulating film 16 electrically insulates adjacent ones of the lower electrodes 31 from each other, and the upper surface thereof is flattened so as to be substantially at the same height as the lower electrode 31.

Note that the capacitor insulating film 32, the upper electrode 33 and the buried insulating film 16 are formed by etching using the same mask, while the first insulating barrier layer 15 is etched using a mask different from that for the upper electrode 33, the capacitor insulating film 32, etc.

The upper surface of the upper electrode 33, and the side surface of the upper electrode 33, the capacitor insulating film 32 and the buried insulating film 16, are covered with a second insulating barrier layer 17. For example, the second insulating barrier layer 17 is made of aluminum oxide, has a thickness of about 5 nm to 100 nm, and prevents the diffusion of hydrogen. The second insulating barrier layer 17 is in contact with the upper surface of the first insulating barrier layer 15 in a region beside the lower electrode 31, i.e., a region beside the lower surface of the buried insulating film 16. As a result, the side surface of the lower electrode 31 is covered with the first insulating barrier layer 15, which prevents the diffusion of oxygen and hydrogen. Moreover, the upper electrode 33, the capacitor insulating film 32 and the buried insulating film 16 are covered, with no gap, with the first insulating barrier layer 15, which prevents the diffusion of oxygen and hydrogen, and the second insulating barrier layer 17, which prevents the diffusion of hydrogen.

Note that the first insulating barrier layer 15 and the second insulating barrier layer 17 are not provided in regions other than that of the capacitor 30, e.g., a region where a contact hole to the source/drain region 21 is formed.

A method for manufacturing a semiconductor memory device including a capacitor having such a structure will now be described.

FIG. 2A to FIG. 2C, FIG. 3A and FIG. 3B sequentially illustrate steps of a method for manufacturing a semiconductor memory device according to the first embodiment of the present invention.

Figure 2A:
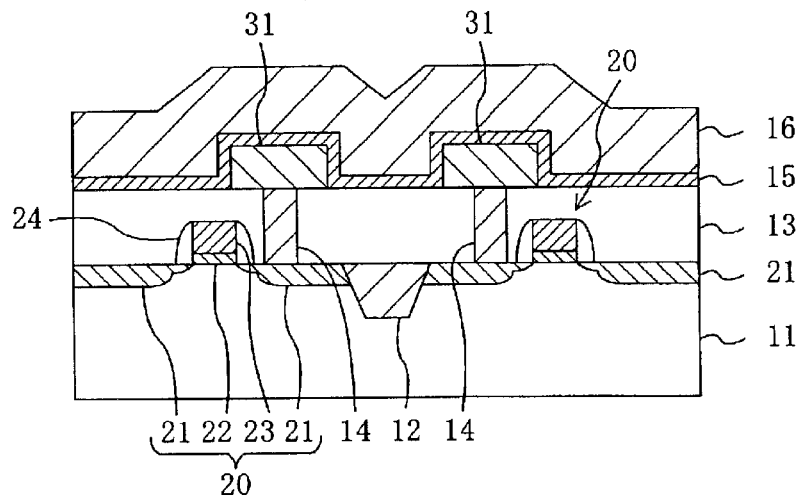
FIG. 2A to FIG. 2C are cross-sectional views sequentially illustrating steps of a method for manufacturing a semiconductor memory device according to the first embodiment of the present invention.

First, as illustrated in FIG. 2A, the gate insulating film 22 and the gate electrode 23 are formed on the semiconductor substrate 11 made of silicon, and a side wall insulating film 24 is formed on the side surface of the gate insulating film 22 and the gate electrode 23. Then, an impurity is implanted into the semiconductor substrate 11 while using the gate electrode 23 and the side wall insulating film 24 as a mask so as to form the source/drain regions 21. In this process, an impurity may be implanted also before the formation of the side wall insulating film 24, so as to obtain the source/drain region 21 having an LDD structure or an extension structure. Then, the interlayer insulating film 13 made of silicon oxide is deposited across the entire surface of the semiconductor substrate 11 including the plurality of cell transistors 20 by using a CVD method. Then, the upper surface of the deposited interlayer insulating film 13 is flattened by using a chemical mechanical polishing (CMP) method, or the like. Then, by using a photolithography method and a dry etching method, a contact hole is formed in the interlayer insulating film 13 so as to reach one of the source/drain regions 21 of each cell transistor 20, and a conductive film made of tungsten or polysilicon is deposited so as to fill each contact hole by using a CVD method. Then, an etch back process or a chemical mechanical polishing process is performed on the deposited conductive film so as to remove the conductive film on the interlayer insulating film 13, thereby forming the plurality of contact plugs 14.

Then, a first conductive barrier layer, which is made of titanium aluminum nitride and prevents the diffusion of oxygen and hydrogen, a second conductive barrier layer, which is made of iridium and prevents the diffusion of oxygen, a third conductive barrier layer, which is made of iridium dioxide and prevents the diffusion of oxygen, and a conductive layer made of platinum, are deposited in this order by using a sputtering method, for example, on the interlayer insulating film 13 including the plurality of contact plugs 14 therein. Thus, a lower electrode forming film is deposited. Then, the lower electrode forming film is patterned by using a photolithography method and a dry etching method so that the remaining portion extends over the contact plug 14. Thus, a plurality of lower electrodes 31 are made from the lower electrode forming film. Then, by using a sputtering method or a CVD method, the first insulating barrier layer 15, which is made of aluminum oxide, has a thickness of about 5 nm to 100 nm, and prevents the diffusion of oxygen and hydrogen, is deposited on the interlayer insulating film 13 so as to cover the upper surface and the side surface of the lower electrode 31. In this process, it is preferred that a heat treatment in an oxidizing atmosphere may be performed after the deposition of the first insulating barrier layer 15, so that aluminum oxide of the first insulating barrier layer 15 is compacted. Then, the buried insulating film 16, which is made of silicon oxide or silicon nitride and has a thickness of about 400 nm to 600 nm is deposited so as to cover the first insulating barrier layer 15 by a CVD method in a hydrogen-containing atmosphere using, for example, monosilane ($SiH_4$) as a material.

Figure 2B:
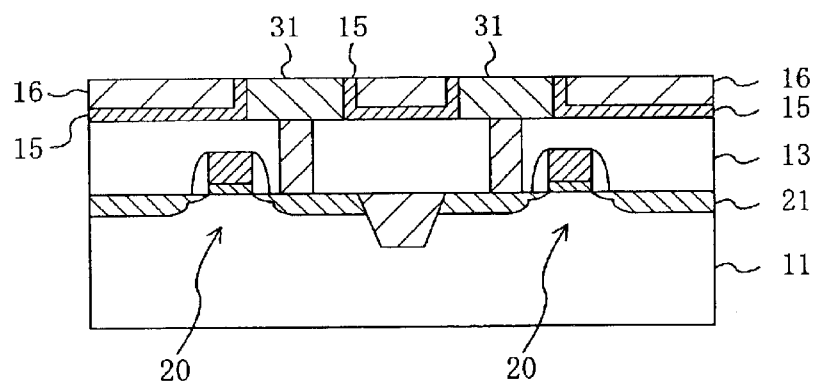

Then, as illustrated in FIG. 2B, the buried insulating film 16 and the first insulating barrier layer 15 are flattened by a CMP method until the lower electrodes 31 are exposed, whereby the lower electrodes 31 are surrounded by the buried insulating film 16. Therefore, the upper surface of the lower electrode 31 is substantially at the same height as the surface on which the buried insulating film 16 and the first insulating barrier layer 15 are exposed.

Figure 2C:
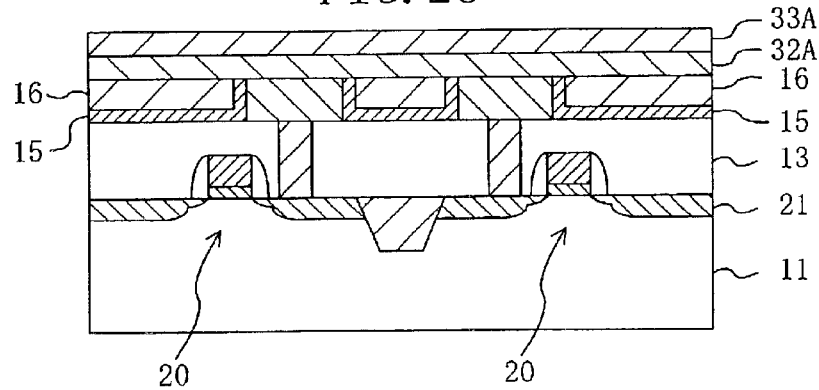

Then, as illustrated in FIG. 2C, a capacitor insulating film forming film 32A, which is made of strontium bismuth tantalum niobate ($SrBi_2(Ta_{1-x}Nb_x)_2O_9$) having a bismuth layered perovskite structure with a thickness of about 50 nm to 150 nm, is deposited across the entire surface of the first insulating barrier layer 15, the buried insulating film 16 and the lower electrode 31 by using a metal organic decomposition method (MOD method), a metal organic chemical vapor deposition method (MOCVD method), or a sputtering method. Then, an upper electrode forming film 33A, which is made of platinum and has a thickness of about 50 nm to 100 nm, is deposited on the capacitor insulating film forming film 32A by using a sputtering method. Then, a heat treatment in an oxygen atmosphere at a temperature of about 650° C. to 800° C. is performed so as to crystallize the metal oxide of the capacitor insulating film forming film 32A.

Figure 3A:
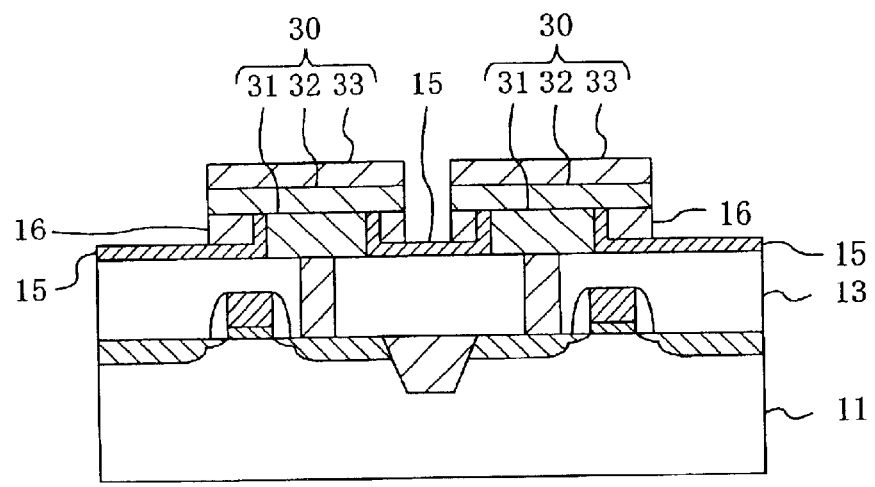
FIG. 3A and FIG. 3B are cross-sectional views sequentially illustrating steps of the method for manufacturing a semiconductor memory device according to the first embodiment of the present invention.

Then, as illustrated in FIG. 3A, by using a photolithography method, a resist pattern (not shown) is formed on the upper electrode forming film 33A, and the upper electrode forming film 33A, the capacitor insulating film forming film 32A and the buried insulating film 16 are dry-etched in this order by using the resist pattern as a mask, thereby forming the upper electrode 33 from the upper electrode forming film 33A and forming the capacitor insulating film 32 from the capacitor insulating film forming film 32A. In this way, the capacitor 30 is formed, including the lower electrode 31, which is electrically connected to the contact plug 14, the capacitor insulating film 32 and the upper electrode 33.

Herein, the first insulating barrier layer 15 is not patterned, and the etching of the buried insulating film 16 is stopped when the first insulating barrier layer 15 is exposed.

Figure 3B:
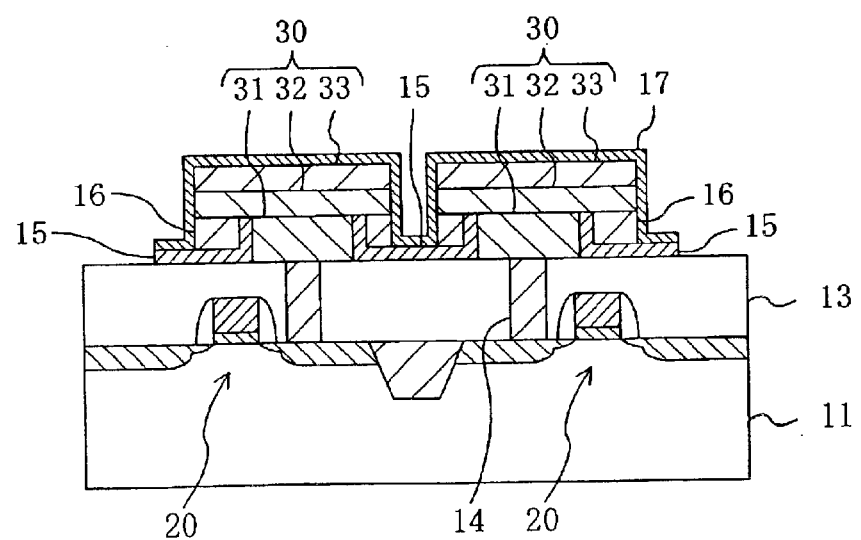

Then, as illustrated in FIG. 3B, the second insulating barrier layer 17, which is made of aluminum oxide, has a thickness of about 5 nm to 100 nm, and prevents the diffusion of hydrogen, is deposited by using a CVD method or a sputtering method on the first insulating barrier layer 15 so as to cover the upper surface and the side surface of the upper electrode 33, the side surface of the capacitor insulating film 32, and the side surface of the buried insulating film 16. In this way, the second insulating barrier layer 17 is in contact, with no gap, with the upper surface of the first insulating barrier layer 15, in a region beside the lower electrode 31 (in the illustrated example, a region beside the lower surface of the buried insulating film 16).

Note that the first insulating barrier layer 15 and the second insulating barrier layer 17 are removed by etching in a region other than the region where the capacitor 30 is present, e.g., a region where another contact hole is formed so as to reach the other one of the source/drain regions 21 of each cell transistor 20.

As described above, according to the first embodiment, the first insulating barrier layer 15, which prevents the diffusion of oxygen and hydrogen, covers the side surface of the lower electrode 31 of the capacitor 30. Thus, it is possible to prevent the conductive oxide such as iridium oxide, which is an oxygen barrier, of the lower electrode 31 from being reduced by hydrogen, thereby preventing the deterioration of the oxygen barrier property thereof.

Furthermore, the second insulating barrier layer 17, which prevents the diffusion of hydrogen, is in contact with the first insulating barrier layer 15, which prevents the diffusion of oxygen and hydrogen, thereby covering the entire capacitor 30 with no gap. Thus, it is possible to prevent the metal oxide of the capacitor insulating film 32 from being reduced by hydrogen, thereby preventing the deterioration of the electrical characteristics of the capacitor 30.

The electrical characteristics of the semiconductor memory device according to the first embodiment will now be compared with those of a semiconductor memory device of a conventional example.

First, the results of an evaluation of the contact resistance between the contact plug 14 and the lower electrode 31 will be shown.

Figure 4:
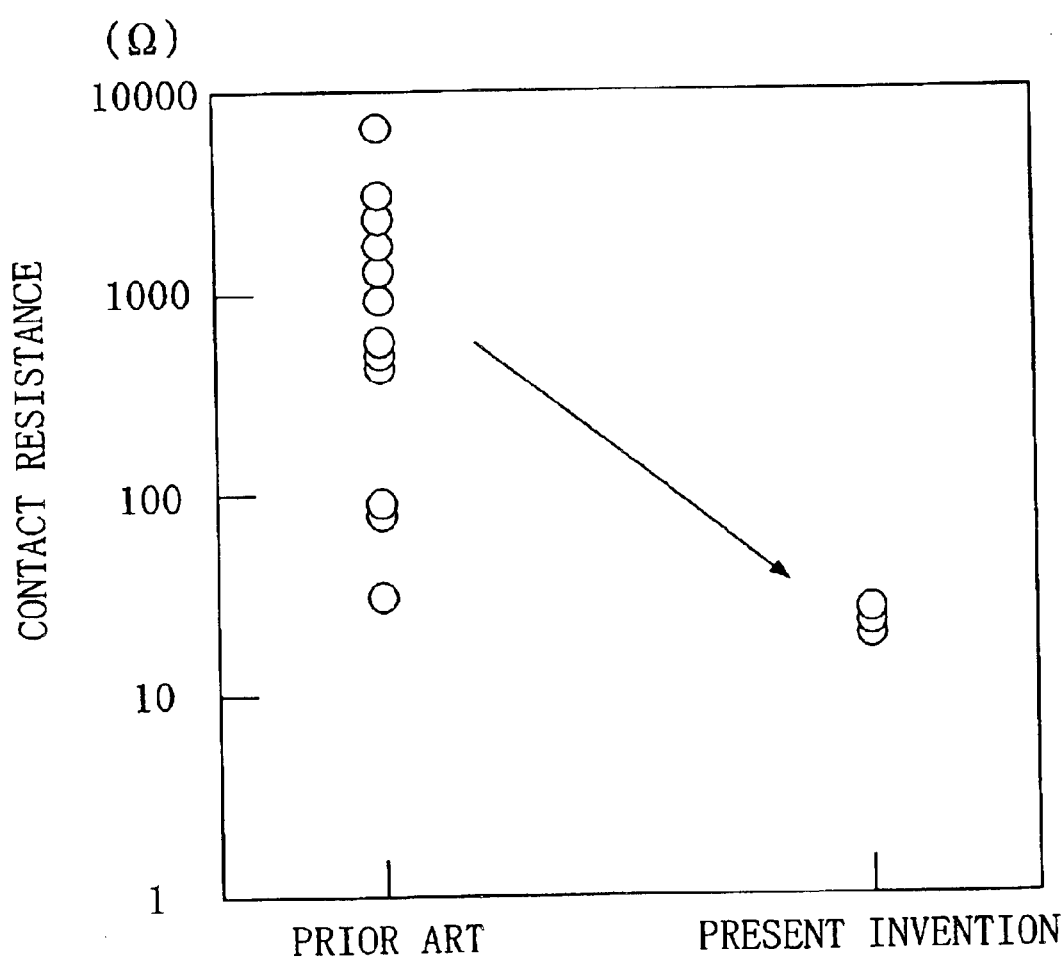
FIG. 4 is a graph showing the results of a measurement of the contact resistance between a contact plug and the lower electrode of the capacitor in the semiconductor memory device according to the first embodiment of the present invention, in comparison with those of a conventional example.

FIG. 4 shows the results of an evaluation of the contact resistance in the plane of a silicon wafer having a diameter of about 20.3 cm (8 inches) according to the first embodiment, and those of the conventional example. As shown in FIG. 4, the contact resistance substantially varies from 45 Ω to 700 Ω in the semiconductor memory device of the conventional example. This is because iridium dioxide, which is a conductive oxide serving as an oxygen barrier, of the lower electrode 110 of the conventional example is reduced by hydrogen, and thus the oxygen barrier property thereof is deteriorated, whereby during a high-temperature oxygen annealing process, which is necessary for crystallization of a high-permittivity dielectric material or a ferroelectric material, oxygen is diffused through the lower electrode 110 to oxidize the surface of the contact plug 107.

It can be seen that, in the semiconductor memory device of the first embodiment, on the other hand, the contact resistance in the wafer plane has very little variations and is in the range of 25 Ω to 35 Ω.

Next, the results of an evaluation of the anti-reduction property of the semiconductor memory device according to the first embodiment will be shown.

Figure 5:
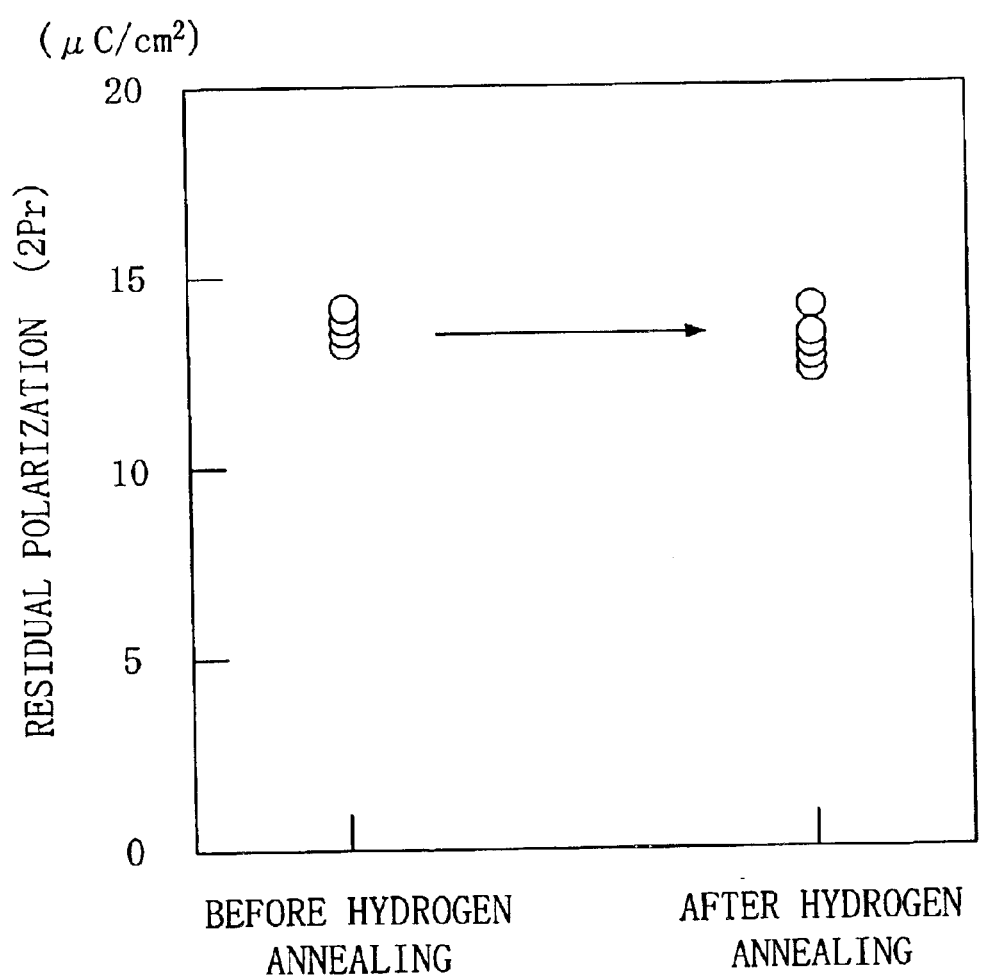
FIG. 5 is a graph showing the results of a measurement of the remnant polarization for the capacitor in the semiconductor memory device according to the first embodiment of the present invention, before and after a hydrogen annealing process.

FIG. 5 shows the results of the evaluation, showing the remnant polarization (2Pr) values of the capacitor 30 before and after the capacitor 30 is subjected to a hydrogen annealing process at 400° C. As can be seen from FIG. 5, the remnant polarization characteristics of the capacitor 30 of the first embodiment do not substantially change through a hydrogen annealing process, indicating that the reduction by hydrogen is prevented sufficiently. Thus, according to the first embodiment, the electrical characteristics of a capacitor and a semiconductor memory device are significantly improved.

Variations of First Embodiment

Figure 6A:
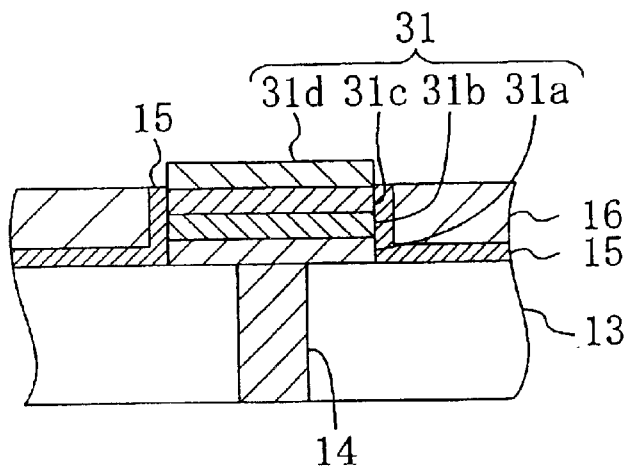
Figure 6B:
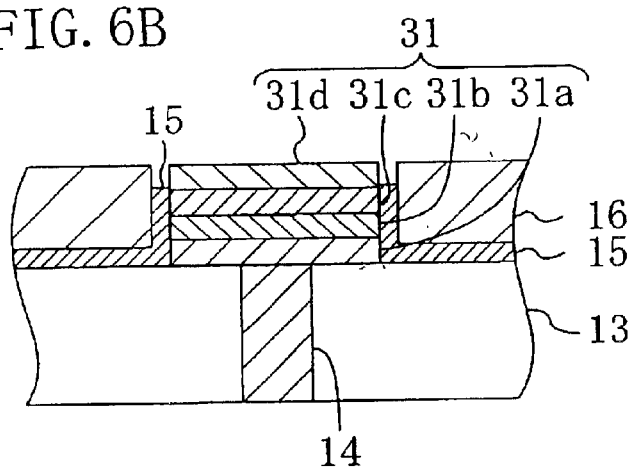
Figure 6C:
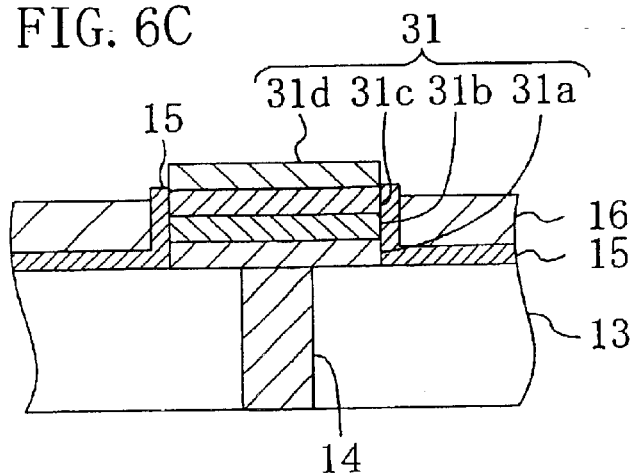

FIG. 6A to FIG. 6C respectively show the first to third variations of the semiconductor memory device of the first embodiment of the present invention, each showing a cross-sectional view of a lower electrode and a first insulating barrier layer covering the side surface of the lower electrode with other elements therearound. In FIG. 6A to FIG. 6C, those elements that are already shown in FIG. 1A will be denoted by the same reference numerals and will not be further described below.

First, as illustrated in the first variation of FIG. 6A, the upper portion of the first insulating barrier layer 15 that covers the side surface of the lower electrode 31 does not need to cover the entire side surface of the lower electrode 31, as long as it covers at least the side surface of the third conductive barrier layer 31c made of iridium dioxide, which is a conductive metal oxide.

Moreover, in such a case, the height of the upper surface of the buried insulating film 16 may be the same as that of the upper end of the first insulating barrier layer 15, as illustrated in the first variation of FIG. 6A, may be the same as that of the upper surface of the conductive layer 31d of the lower electrode 31 as illustrated in the second variation of FIG. 6B, or may be lower than the upper end of the first insulating barrier layer 15 as illustrated in the third variation of FIG. 6C.

Second Embodiment

The second embodiment of the present invention will now be described with reference to the drawings.

Figure 7:
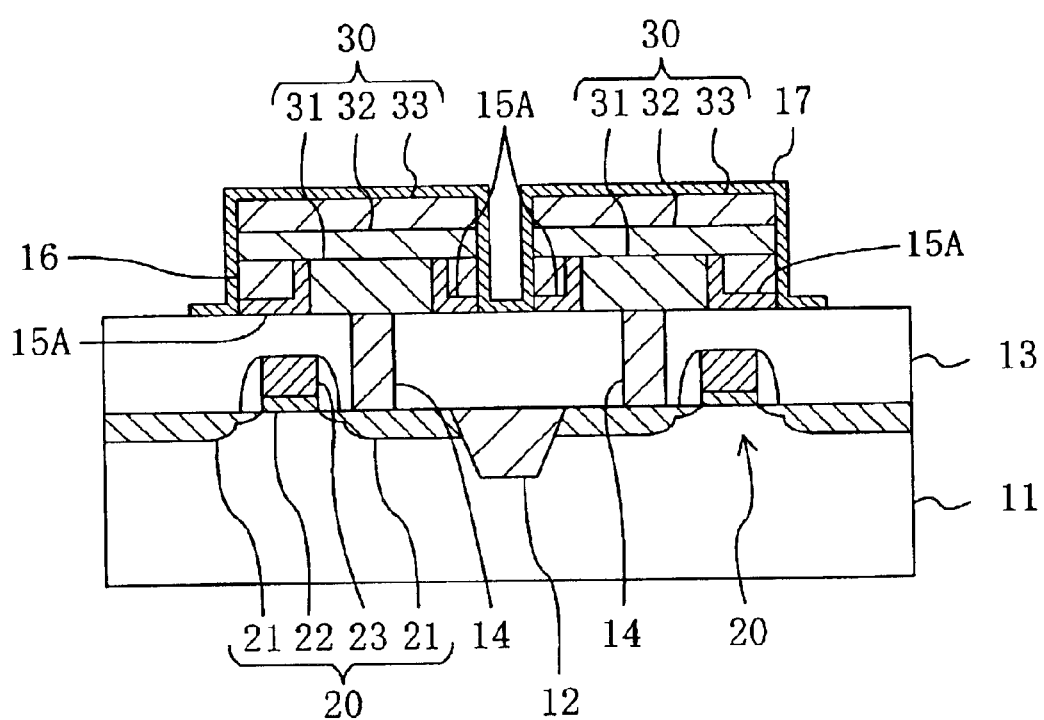
FIG. 7 is a cross-sectional view illustrating an important part of a semiconductor memory device including a capacitor according to the second embodiment of the present invention.

FIG. 7 is a cross-sectional view illustrating an important part of a semiconductor memory device including a capacitor according to the second embodiment of the present invention. In FIG. 7, those elements that are already shown in FIG. 1A and FIG. 1B will be denoted by the same reference numerals and will not be further described below.

As illustrated in FIG. 7, in the second embodiment, the second insulating barrier layer 17 is formed directly on the interlayer insulating film 13, and a first insulating barrier layer 15A is divided between the capacitors 30 adjacent to each other in the gate length direction.

Figure 8A:
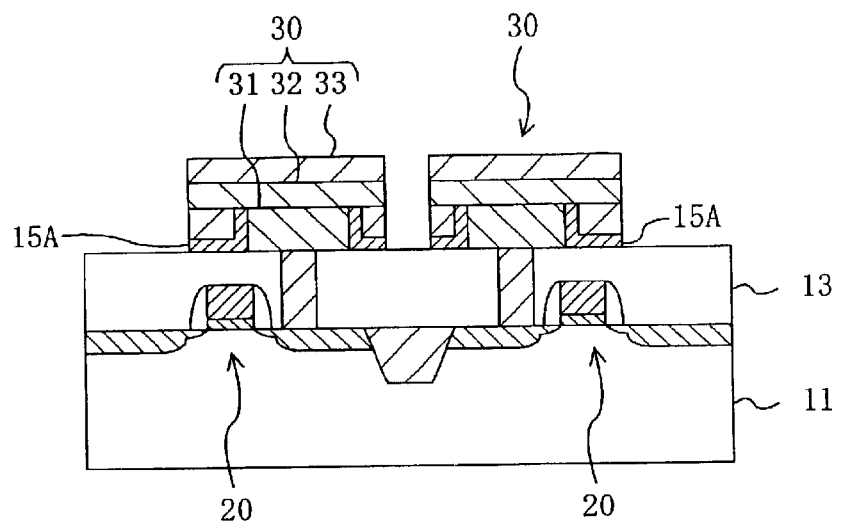
FIG. 8A and FIG. 8B are cross-sectional views illustrating a method for manufacturing a semiconductor memory device according to the second embodiment of the present invention, wherein only those steps that are different from the first embodiment are illustrated.
Figure 8B:
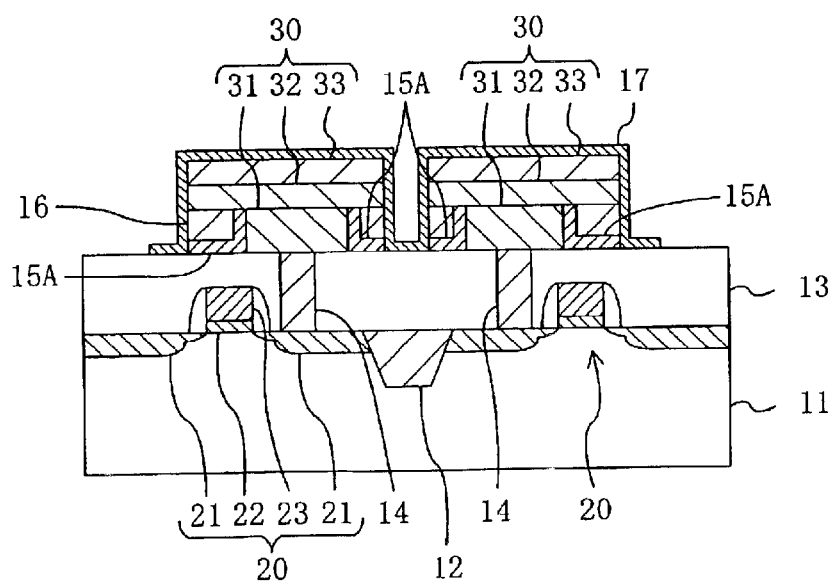

FIG. 8A and FIG. 8B illustrate important steps of a method for manufacturing a semiconductor memory device according to the second embodiment.

Only the difference from the first embodiment will be described below.

In the first embodiment, the capacitor insulating film 32, the upper electrode 33 and the buried insulating film 16 surrounding the lower electrode 31, which are elements of the capacitor 30, are patterned using the same mask, and in this process, the first insulating barrier layer 15 is not patterned, as illustrated in FIG. 3A.

When manufacturing the semiconductor memory device of the second embodiment, on the other hand, in the etching step of patterning the upper electrode 33, the capacitor insulating film 32, etc., the buried insulating film 16 is etched by using the same mask as the upper electrode 33, after which the first insulating barrier layer 15 is etched into a first insulating barrier layer 15A, as illustrated in FIG. 7 and FIG. 8A. In this process, an etching gas whose main component is fluorocarbon is used for the etching of the buried insulating film 16, which is made of silicon oxide or silicon nitride, whereas an etching gas whose main component is a chlorine gas is used for the etching of the first insulating barrier layer 15A, which is made of aluminum oxide.

Then, as illustrated in FIG. 8B, the subsequent step, i.e., the step of depositing the second insulating barrier layer 17, which prevents the diffusion of hydrogen, is performed so that the second insulating barrier layer 17 is in contact with the end surface of the first insulating barrier layer 15, which is located beside the lower electrode 31 and under the buried insulating film 16.

Note that also in the second embodiment, the first insulating barrier layer 15A and the second insulating barrier layer 17 are removed by etching in a region other than the region where the capacitor 30 is present, e.g., a region where another contact hole is formed so as to reach the other one of the source/drain regions 21 of each cell transistor 20.

As described above, according to the second embodiment, as in the first embodiment, the first insulating barrier layer 15A, which prevents the diffusion of oxygen and hydrogen, covers the side surface of the lower electrode 31 of the capacitor 30. Thus, it is possible to prevent the conductive oxide such as iridium oxide, which is an oxygen barrier, of the lower electrode 31 from being reduced by hydrogen, thereby preventing the deterioration of the oxygen barrier property thereof.

Furthermore, the second insulating barrier layer 17, which prevents the diffusion of hydrogen, is in contact with the first insulating barrier layer 15A, which prevents the diffusion of oxygen and hydrogen, thereby covering the entire capacitor 30 with no gap. Thus, it is possible to prevent the metal oxide of the capacitor insulating film 32 from being reduced by hydrogen, thereby preventing the deterioration of the electrical characteristics of the capacitor 30. As a result, also in the second embodiment, it is possible to realize a semiconductor memory device including the capacitor 30 having desirable electrical characteristics as shown in the measurement results of FIG. 4 and FIG. 5.

Moreover, the second embodiment provides additional effects as follows.

In the step of removing the insulating barrier layers 15 and 17 on the interlayer insulating film 13 in a region other than the region where the capacitor 30 is present, it is necessary in the first embodiment to perform an etching process for two layers, i.e., the second insulating barrier layer 17 and the first insulating barrier layer 15. In the second embodiment, on the other hand, it is only necessary to etch the second insulating barrier layer 17, whereby it is possible to significantly reduce the etching time. In addition, although steps may occur on the interlayer insulating film 13 between an area where the capacitor 30 is provided and an area where the capacitor 30 is not provided, the etching time is reduced, whereby a resist is less likely to disappear during the etching process even in an area on the capacitor 30 where the resist pattern has a small thickness. As a result, the process margin can be increased.

Third Embodiment

A third embodiment of the present invention will now be described with reference to the drawings.

Figure 9A:
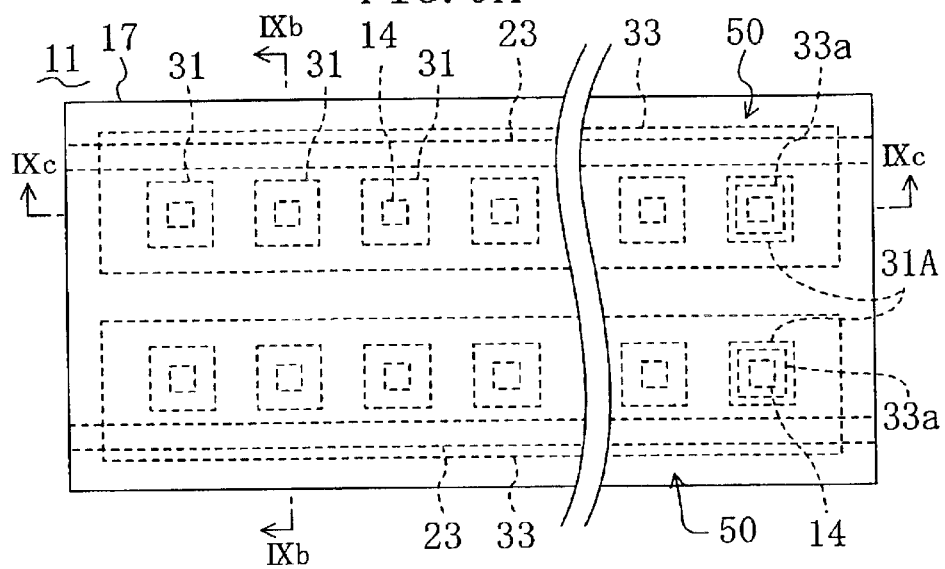
Figure 9B:
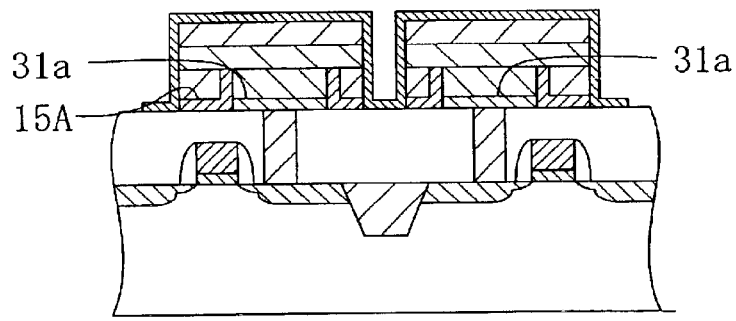
Figure 9C:
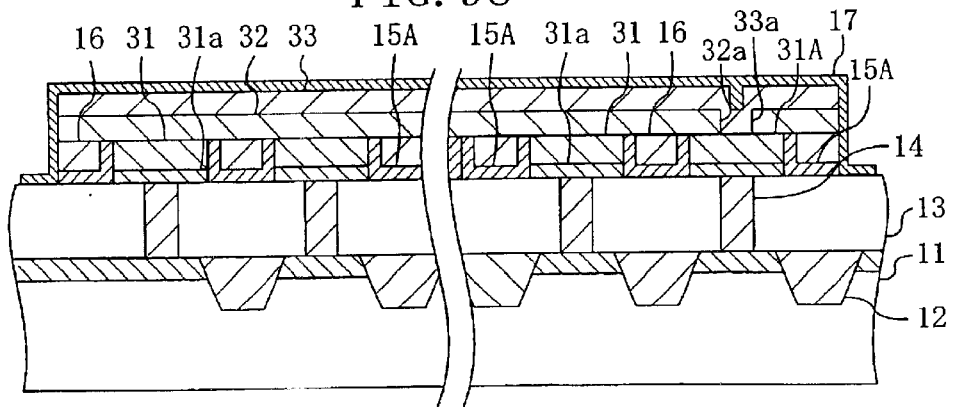

FIG. 9A to FIG. 9C illustrate a semiconductor memory device according to the third embodiment of the present invention, wherein FIG. 9A is a plan view illustrating cell blocks forming a memory cell array, each block including a plurality of cells, FIG. 9B is a cross-sectional view taken along line IXb—IXb of FIG. 9A, and FIG. 9C is a cross-sectional view taken along line IXc—IXc of FIG. 9A. In FIG. 9A to FIG. 9C, those elements that are already shown in FIG. 7 will be denoted by the same reference numerals and will not be further described below.

As illustrated in FIG. 9A, cell blocks 50 are arranged on the primary surface of the semiconductor substrate 11. Each cell block 50 includes, for example, $2^n$ or $(2^n+1)$ (where n is an integer of 3 or more) lower electrodes 31, which are arranged along the gate electrode (word line) 23 of the cell transistors 20. The capacitor insulating film 32 and the upper electrode 33 of the capacitor 30 are formed so as to cover a plurality of lower electrodes 31 included in one cell block 50.

Moreover, as illustrated in FIG. 9A and FIG. 9C, the second insulating barrier layer 17 covers two cell blocks 50 that are adjacent to each other, and side portions thereof extending in the direction in which the gate electrode 23 extends are in contact with the interlayer insulating film 13. Furthermore, as illustrated in FIG. 9B, in each cell block 50, side portions of the second insulating barrier layer 17 extending in the gate length direction, i.e., in the direction perpendicular to the gate electrode 23, are in contact with the interlayer insulating film 13, as in the second embodiment.

Thus, the side surface of the lower electrode 31 of the capacitor 30 is covered with the first insulating barrier layer 15A, and the upper surface and the side surface of the upper electrode 33 of the capacitor 30 and the side surface of the capacitor insulating film 32, including the side surface of the buried insulating film 16 surrounding the lower electrode 31, are covered with the second insulating barrier layer 17 by cell blocks (for every two blocks in the illustrated example). The second insulating barrier layer 17 is in contact with the end surface of the first insulating barrier layer 15A located under the buried insulating film 16.

In addition, as illustrated in FIG. 9A and FIG. 9C, an opening 32a is provided in the capacitor insulating film 32 of each cell block 50 so that the upper electrode 33 is electrically connected to one of the plurality of lower electrodes 31. The opening 32a is filled with a portion of the upper electrode 33, thereby forming an upper electrode plug 33a. In the illustrated example, the rightmost one of the lower electrodes 31 is used as an upper electrode connection electrode 31A, for example, whereby a predetermined voltage can be applied from the source/drain region 21 of the cell transistor 20 to the upper electrode 33 via the contact plug 14, the upper electrode connection electrode 31A and the upper electrode plug 33a.

Thus, unlike the cell transistor (first transistor) 20 that is electrically connected to the lower electrode 31 of the capacitor 30 via the contact plug (first contact plug) 14, the upper electrode connection electrode 31A does not form a part of the capacitor 30. Therefore, the cell transistor (second transistor) 20 that is electrically connected to the upper electrode connection electrode 31A via the contact plug (second contact plug) 14 operates differently from the first transistor.

Thus, in the third embodiment, an operating voltage can be applied to the upper electrode 33 via the cell transistor 20.

Therefore, it is not necessary to make a contact hole on the upper surface of the upper electrode 33, i.e., in the second insulating barrier layer 17. Therefore, it is not necessary to make an opening in the second insulating barrier layer 17, which covers the cell block 50, thereby eliminating the need for the resist ashing process, the plug filling process, and the wiring process, which are performed after the opening is made. As a result, after the formation of the second insulating barrier layer 17, the capacitor 30 is not exposed to hydrogen, thereby preventing the deterioration of the characteristics of the capacitor 30.

Note that while each second insulating barrier layer 17 covers two cell blocks 50 in the third embodiment, the present invention is not limited thereto, as long as the second insulating barrier layer 17 covers one or more cell blocks 50.

Moreover, it may not be necessary to provide the upper electrode connection electrode 31A for the electrical connection between the upper electrode 33 and the cell transistor 20, but the upper electrode plug 33a and the contact plug 14 may alternatively be connected directly to each other. However, since all of the capacitors 30 included in the cell block 50 have the same structure, it is preferred that the upper electrode connection electrode 31A, which is structurally the same as the lower electrode 31, is provided between the upper electrode plug 33a and the contact plug 14 so as to simplify the manufacturing process.

A method for manufacturing a semiconductor memory device including a capacitor and an upper electrode connection electrode having such a structure will now be described with reference to the drawings.

FIG. 10A to FIG. 10C, FIG. 11A and FIG. 11B are cross-sectional views taken along line IXc—IXc of FIG. 9A sequentially illustrating steps of a method for manufacturing a semiconductor memory device according to the third embodiment of the present invention.

First, the gate insulating film 22, the gate electrode 23 and the side wall insulating film 24, which are illustrated in FIG. 9B, are selectively formed on the semiconductor substrate 11 made of silicon, and then the source/drain regions 21 are formed in an upper portion of the semiconductor substrate 11 on opposite sides of the gate electrode 23. In this way, a plurality of cell transistors 20 are formed.

Figure 10A:
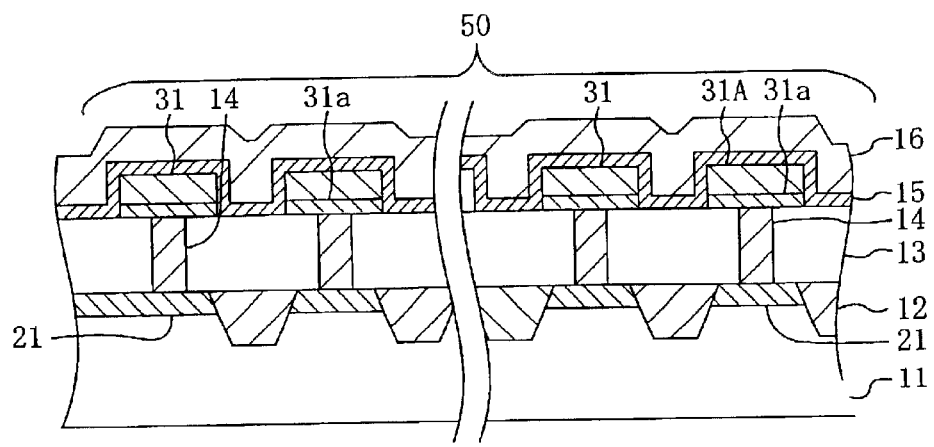
FIG. 10A to FIG. 10C are cross-sectional views taken along line IXc—IXc of FIG. 9A, sequentially illustrating steps of a method for manufacturing a semiconductor memory device according to the third embodiment of the present invention.

Then, as illustrated in FIG. 10A, the interlayer insulating film 13, which is made of silicon oxide such as BPSG, for example, is deposited across the entire surface of the semiconductor substrate 11, including the plurality of cell transistors 20, by using a CVD method. Then, the upper surface of the deposited interlayer insulating film 13 is flattened by using a CMP method, or the like. Then, a contact hole is formed in the interlayer insulating film 13 so as to reach one of the source/drain regions 21 of each cell transistor 20 by using a photolithography method and a dry etching method, and a conductive film made of tungsten or polysilicon is deposited so as to fill each contact hole by using a CVD method. Then, an etch back process or a CMP process is performed on the deposited conductive film so as to remove the conductive film on the interlayer insulating film 13, thereby forming the plurality of contact plugs 14. Then, the first conductive barrier layer 31a, which is made of titanium aluminum nitride and prevents the diffusion of oxygen and hydrogen, the second conductive barrier layer 31b, which is made of iridium and prevents the diffusion of oxygen, the third conductive barrier layer 31c, which is made of iridium dioxide and prevents the diffusion of oxygen, and the conductive layer 31d made of platinum, are deposited in this order by using a sputtering method, for example, on the interlayer insulating film 13 including the plurality of contact plugs 14 therein. Thus, a lower electrode forming film is deposited. Herein, the first conductive barrier layer 31a, which prevents the diffusion of oxygen and hydrogen, has a thickness of about 40 nm to 100 nm, and the second conductive barrier layer 31b and the third conductive barrier layer 31c, which prevent the diffusion of oxygen, and the conductive layer 31d, each have a thickness of about 50 nm to 100 nm. Then, the lower electrode forming film is patterned by using a photolithography method and a dry etching method so that the remaining portion extends over the contact plug 14. Thus, a plurality of lower electrodes 31 are made from the lower electrode forming film. Then, by using a sputtering method or a CVD method, the first insulating barrier layer 15, which is made of aluminum oxide, has a thickness of about 20 nm to 200 nm, and prevents the diffusion of oxygen and hydrogen, is deposited on the interlayer insulating film 13 so as to cover the upper surface and the side surface of the lower electrode 31. In this process, it is preferred that a heat treatment in an oxidizing atmosphere may be performed after the deposition of the first insulating barrier layer 15, so that aluminum oxide of the first insulating barrier layer 15 is compacted. Then, the buried insulating film 16, which is made of silicon oxide or silicon nitride and has a thickness of about 400 nm to 600 nm is deposited so as to cover the first insulating barrier layer 15 by a CVD method in a hydrogen-containing atmosphere using, for example, monosilane as a material.

Figure 10B:
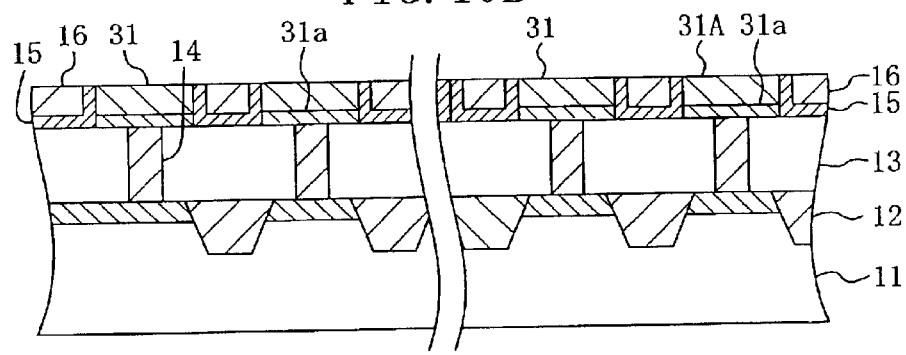

Then, as illustrated in FIG. 10B, the buried insulating film 16 and the first insulating barrier layer 15 are flattened by a CMP method until the lower electrodes 31 are exposed, whereby the lower electrodes 31 are surrounded by the buried insulating film 16. Therefore, the upper surface of the lower electrode 31 is substantially at the same height as the surface on which the buried insulating film 16 and the first insulating barrier layer 15 are exposed.

Figure 10C:
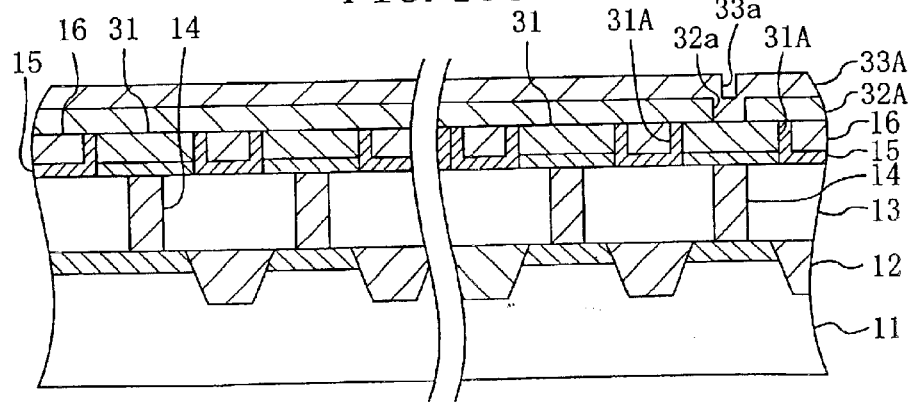

Then, as illustrated in FIG. 10C, the capacitor insulating film forming film 32A, which is made of strontium bismuth tantalum niobate $(SrBi_2(Ta_{1-x}Nb_x)_2O_9)$ having a bismuth layered perovskite structure with a thickness of about 50 nm to 150 nm, is deposited across the entire surface of the first insulating barrier layer 15, the buried insulating film 16 and the lower electrode 31 by using an MOD method, an MOCVD method, or a sputtering method. Then, a portion of the deposited capacitor insulating film forming film 32A that is located over the upper electrode connection electrode 31A is selectively removed by using a photolithography method and a dry etching method. Thus, the opening 32a is formed in the capacitor insulating film forming film 32A, with the upper electrode connection electrode 31A being exposed through the obtained opening 32a. Then, the upper electrode forming film 33A, which is made of platinum and has a thickness of about 50 nm to 150 nm, is deposited on the capacitor insulating film forming film 32A so as to fill the opening 32a. Thus, the opening 32a is filled with platinum, thereby forming the upper electrode plug 33a, with which the upper electrode connection electrode 31A and the upper electrode 33 are electrically connected to each other. Then, a heat treatment in an oxygen atmosphere at a temperature of about 650° C. to 800° C. is performed so as to crystallize the metal oxide of the capacitor insulating film forming film 32A.

Figure 11A:
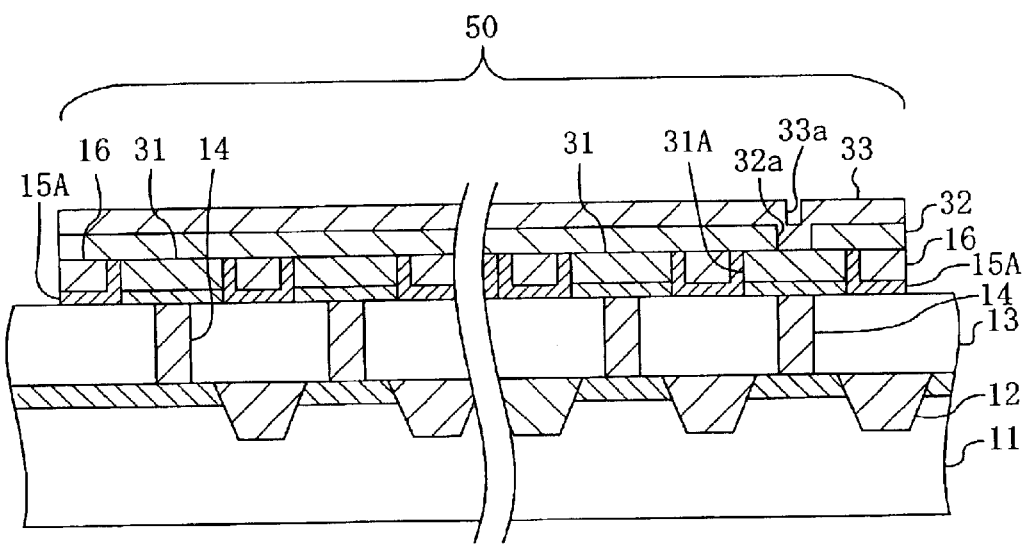
FIG. 11A and FIG. 11B are cross-sectional views taken along line IXc—IXc of FIG. 9A, sequentially illustrating steps of the method for manufacturing a semiconductor memory device according to the third embodiment of the present invention.

Then, as illustrated in FIG. 11A, the upper electrode forming film 33A, the capacitor insulating film forming film 32A, the buried insulating film 16 and the first insulating barrier layer 15 are dry-etched in this order by using a resist mask (not shown) that masks each cell block 50, thereby forming the upper electrode 33 from the upper electrode forming film 33A and forming the capacitor insulating film 32 from the capacitor insulating film forming film 32A. In this process, the first insulating barrier layer 15 is patterned into the first insulating barrier layer 15A.

Figure 11B:
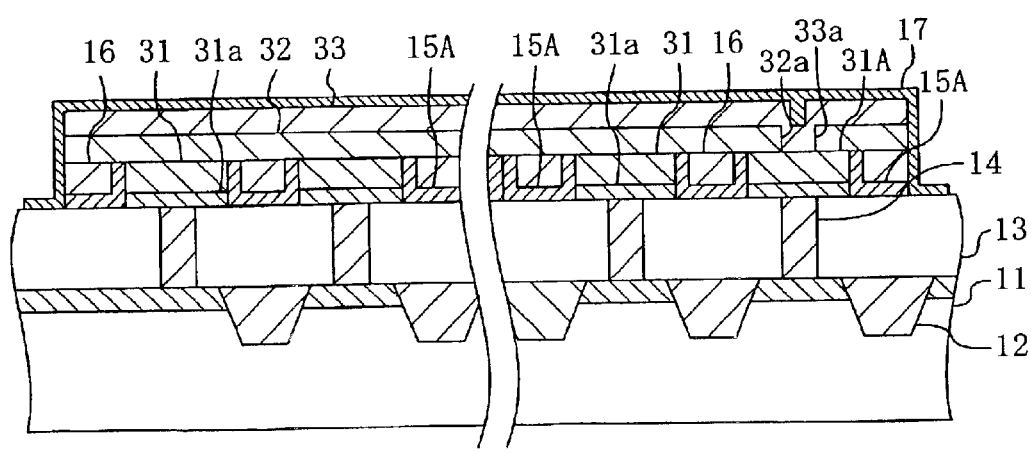

Then, as illustrated in FIG. 11B, by using a CVD method or a sputtering method, the second insulating barrier layer 17, which is made of aluminum oxide, has a thickness of 5 nm to 100 nm, and prevents the diffusion of hydrogen, is deposited across the entire surface of the interlayer insulating film 13 so as to cover the upper surface and the side surface of the upper electrode 33, the side surface of the capacitor insulating film 32 and the buried insulating film 16, and the end surface of the first insulating barrier layer 15A, which have been patterned into divisions respectively corresponding to the cell blocks 50. In this way, the second insulating barrier layer 17 is in contact with the end surface of the first insulating barrier layer 15A located under the buried insulating film 16 along the periphery of the cell block 50. Then, as illustrated in FIG. 9A, the deposited second insulating barrier layer 17 is patterned by using a dry etching method so that each division includes two cell blocks 50 that are adjacent to each other. Note however that the patterning on the second insulating barrier layer 17 may not need to be performed.

As a variation of the manufacturing method of the third embodiment, the first insulating barrier layer 15 may not be patterned in the step shown in FIG. 11A, i.e., the step of patterning the upper electrode 33, the capacitor insulating film 32, etc., into divisions respectively corresponding to the cell blocks 50, but the first insulating barrier layer 15 may be patterned successively with the second insulating barrier layer 17 in the subsequent step illustrated in FIG. 11B, as in the manufacturing method of the first embodiment.

Fourth Embodiment

The fourth embodiment of the present invention will now be described with reference to the drawings.

Figure 12A:
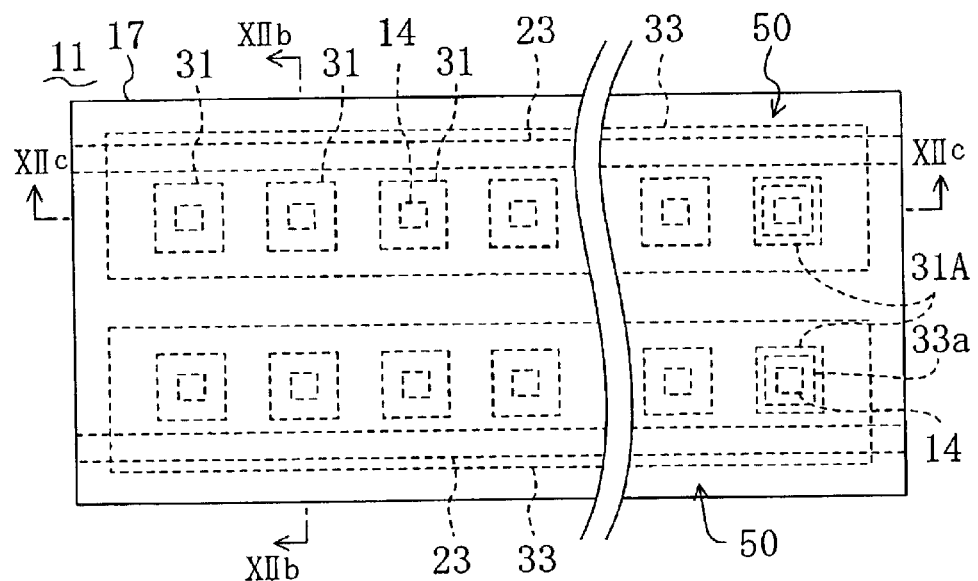
Figure 12B:
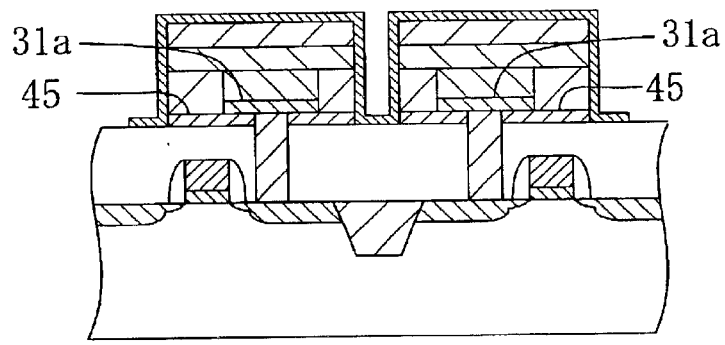
Figure 12C:
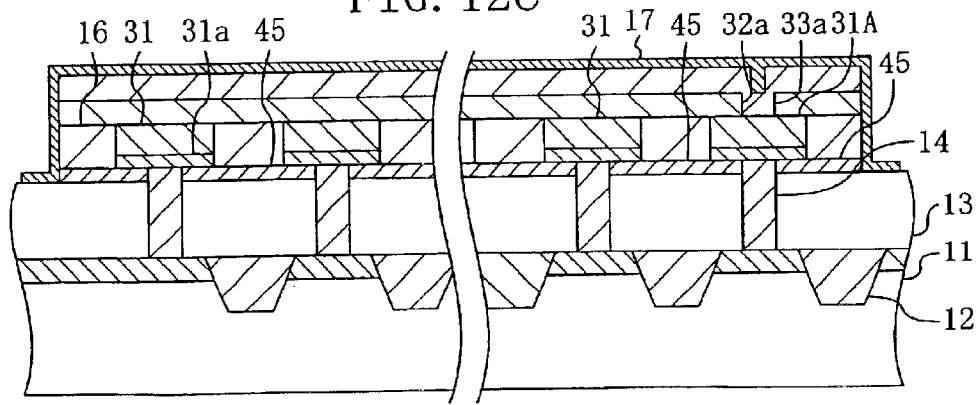

FIG. 12A to FIG. 12C illustrate a semiconductor memory device according to the fourth embodiment of the present invention, wherein FIG. 12A is a plan view illustrating cell blocks each including a plurality of cells forming a memory cell array, FIG. 12B is a cross-sectional view taken along line XIIb—XIIb of FIG. 12A, and FIG. 12C is a cross-sectional view taken along line XIIc—XIIc of FIG. 12A. In FIG. 12A to FIG. 12C, those elements that are already shown in FIG. 9A to FIG. 9C will be denoted by the same reference numerals and will not be further described below.

As illustrated in FIG. 12B and FIG. 12C, a first insulating barrier layer 45 of the fourth embodiment is formed only on the interlayer insulating film 13, and thus the contact plug 14 is formed to run through the interlayer insulating film 13 and the first insulating barrier layer 45. Furthermore, the first conductive barrier layer 31a of the lower electrode 31 of the capacitor 30 is formed on the first insulating barrier layer 45. Herein, the first insulating barrier layer 45, which prevents the diffusion of oxygen and hydrogen, is preferably made of aluminum oxide, titanium aluminum oxide or tantalum aluminum oxide, as in the first to third embodiments, and more preferably made of silicon nitride $(Si_3N_4)$ or silicon oxynitride (SiON). If silicon nitride or silicon oxynitride is used, the formation of a contact hole for forming the contact plug 14 is made easier than in a case where aluminum oxide, or the like, is used.

Moreover, as illustrated in FIG. 12A, the second insulating barrier layer 17 is formed so as to cover two cell blocks 50 that are adjacent to each other. Furthermore, as illustrated in FIG. 12B, in each cell block 50, the second insulating barrier layer 17 is in contact with the interlayer insulating film 13 in the direction perpendicular to the gate electrode 23. Thus, the upper surface and the side surface of the upper electrode 33 of the capacitor 30 and the side surface of the capacitor insulating film 32, including the side surface of the buried insulating film 16 surrounding the lower electrode 31, are covered with the second insulating barrier layer 17 by cell blocks (for every two blocks in the illustrated example). The second insulating barrier layer 17 is in contact with the end surface of the first insulating barrier layer 15 located under the buried insulating film 16.

Furthermore, as in the third embodiment, the opening 32a is provided so that the upper electrode 33 is electrically connected to one of the plurality of lower electrodes 31, and the opening 32a is filled with a portion of the upper electrode 33, thereby forming the upper electrode plug 33a. Thus, an operating voltage can be applied to the upper electrode 33 via the cell transistor 20 without making an opening in the second insulating barrier layer 17, which covers the upper surface and the side surface of the cell block 50. This eliminates the need for the resist ashing process, the plug filling process, and the wiring process, which are performed after the opening is made. As a result, after the formation of the second insulating barrier layer 17, the capacitor 30 is not exposed to hydrogen, thereby preventing the deterioration of the characteristics of the capacitor 30.

Note that also in the fourth embodiment, as in the third embodiment, the second insulating barrier layer 17 covers two cell blocks 50. However, the present invention is not limited thereto, as long as the second insulating barrier layer 17 covers one or more cell blocks 50.

Moreover, it may not be necessary to provide the upper electrode connection electrode 31A for the electrical connection between the upper electrode 33 and the cell transistor 20.

A method for manufacturing a semiconductor memory device including a capacitor and an upper electrode connection electrode having such a structure will now be described with reference to the drawings.

FIG. 13A to FIG. 13C, FIG. 14A and FIG. 14B are cross-sectional views taken along line XIIc—XIIc of FIG. 12A sequentially illustrating steps of a method for manufacturing a semiconductor memory device according to the fourth embodiment of the present invention.

First, the gate insulating film 22, the gate electrode 23 and the side wall insulating film 24, which are illustrated in FIG. 12B, are selectively formed on the semiconductor substrate 11 made of silicon, and then the source/drain regions 21 are formed in an upper portion of the semiconductor substrate 11 on opposite sides of the gate electrode 23. In this way, a plurality of cell transistors 20 are formed.

Figure 13A:
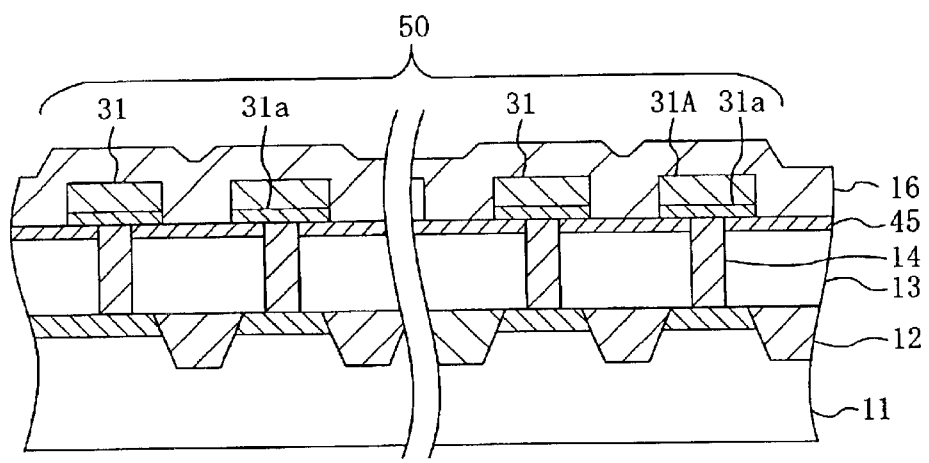
FIG. 13A to FIG. 13C are cross-sectional views taken along line XIIc—XIIc of FIG. 12A, sequentially illustrating steps of a method for manufacturing a semiconductor memory device according to the fourth embodiment of the present invention.

Then, as illustrated in FIG. 13A, the interlayer insulating film 13, which is made of silicon oxide such as BPSG, for example, is deposited across the entire surface of the semiconductor substrate 11, including the plurality of cell transistors 20, by using a CVD method. Then, the upper surface of the deposited interlayer insulating film 13 is flattened by using a CMP method, or the like, after which the first insulating barrier layer 45, which is made of, for example, silicon nitride or aluminum oxide, has a thickness of about 20 nm to 200 nm, and prevents the diffusion of oxygen and hydrogen, is deposited by using a CVD method or a sputtering method. Then, a contact hole is formed in the interlayer insulating film 13 and the first insulating barrier layer 45 so as to reach one of the source/drain regions 21 of each cell transistor 20 by using a photolithography method and a dry etching method, and a conductive film made of tungsten or polysilicon is deposited so as to fill each contact hole by using a CVD method. Then, an etch back process or a CMP process is performed on the deposited conductive film so as to remove the conductive film on the interlayer insulating film 13, thereby forming the plurality of contact plugs 14. Then, the first conductive barrier layer 31a, which is made of titanium aluminum nitride and prevents the diffusion of oxygen and hydrogen, the second conductive barrier layer 31b, which is made of iridium and prevents the diffusion of oxygen, the third conductive barrier layer 31c, which is made of iridium dioxide and prevents the diffusion of oxygen, and the conductive layer 31d made of platinum, are deposited in this order by using a sputtering method, for example, on the interlayer insulating film 13 including the plurality of contact plugs 14 therein. Thus, a lower electrode forming film is deposited. Herein, the first conductive barrier layer 31a, which prevents the diffusion of oxygen and hydrogen, has a thickness of about 40 nm to 100 nm, and the second conductive barrier layer 31b and the third conductive barrier layer 31c, which prevent the diffusion of oxygen, and the conductive layer 31d, each have a thickness of about 50 nm to 100 nm. Then, the lower electrode forming film is patterned by using a photolithography method and a dry etching method so that the remaining portion extends over the contact plug 14. Thus, a plurality of lower electrodes 31 are made from the lower electrode forming film. Then, the buried insulating film 16, which is made of silicon oxide or silicon nitride and has a thickness of about 400 nm to 600 nm is deposited so as to cover the plurality of lower electrodes 31 by a CVD method in a hydrogen-containing atmosphere using, for example, monosilane as a material.

Figure 13B:
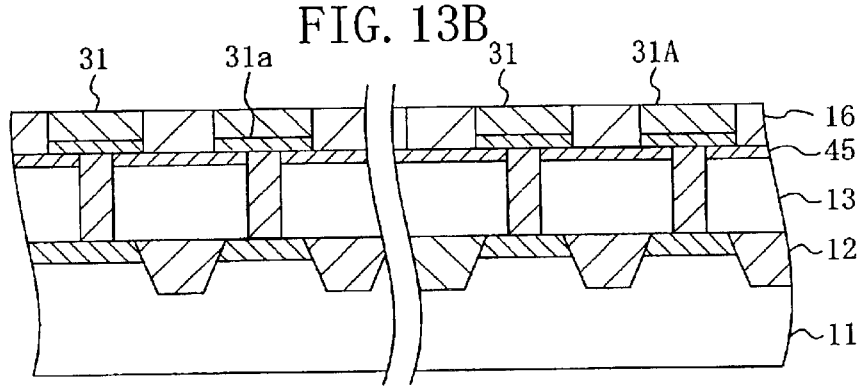

Then, as illustrated in FIG. 13B, the buried insulating film 16 is flattened by a CMP method until the lower electrodes 31 are exposed, whereby the lower electrodes 31 are surrounded by the buried insulating film 16. Therefore, the upper surface of the lower electrode 31 is substantially at the same height as the surface on which the buried insulating film 16 is exposed.

Figure 13C:
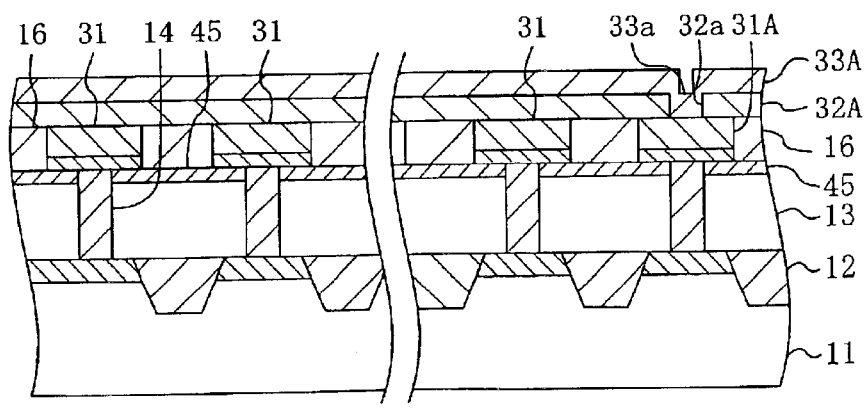

Then, as illustrated in FIG. 13C, the capacitor insulating film forming film 32A, which is made of strontium bismuth tantalum niobate having a bismuth layered perovskite structure with a thickness of about 50 nm to 150 nm, is deposited across the entire surface of the buried insulating film 16 and the lower electrode 31 by using an MOD method, an MOCVD method, or a sputtering method. Then, a portion of the deposited capacitor insulating film forming film 32A that is located over the upper electrode connection electrode 31A is selectively removed by using a photolithography method and a dry etching method. Thus, the opening 32a is formed in the capacitor insulating film forming film 32A, with the upper electrode connection electrode 31A being exposed through the obtained opening 32a. Then, the upper electrode forming film 33A, which is made of platinum and has a thickness of about 50 nm to 150 nm, is deposited on the capacitor insulating film forming film 32A so as to fill the opening 32a. Thus, the opening 32a is filled with platinum, thereby forming the upper electrode plug 33a, with which the upper electrode connection electrode 31A and the upper electrode 33 are electrically connected to each other. Then, a heat treatment in an oxygen atmosphere at a temperature of about 650° C. to 800° C. is performed so as to crystallize the metal oxide of the capacitor insulating film forming film 32A.

Figure 14A:
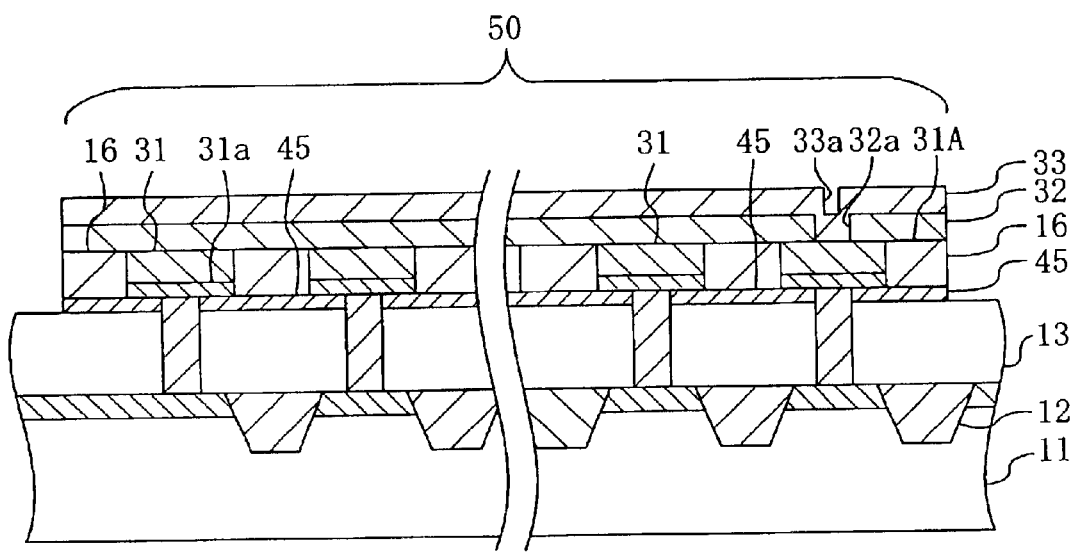
FIG. 14A and FIG. 14B are cross-sectional views taken along line XIIc—XIIc of FIG. 12A, sequentially illustrating steps of the method for manufacturing a semiconductor memory device according to the fourth embodiment of the present invention.

Then, as illustrated in FIG. 14A, the upper electrode forming film 33A, the capacitor insulating film forming film 32A, the buried insulating film 16 and the first insulating barrier layer 45 are dry-etched in this order by using a resist mask (not shown) that masks each cell block 50, thereby forming the upper electrode 33 from the upper electrode forming film 33A and forming the capacitor insulating film 32 from the capacitor insulating film forming film 32A.

Figure 14B:
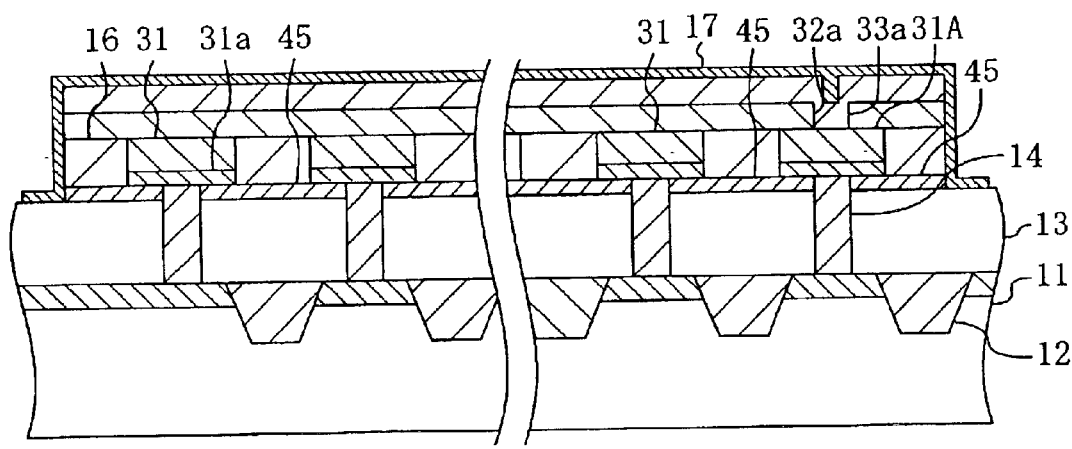
Figure 15:
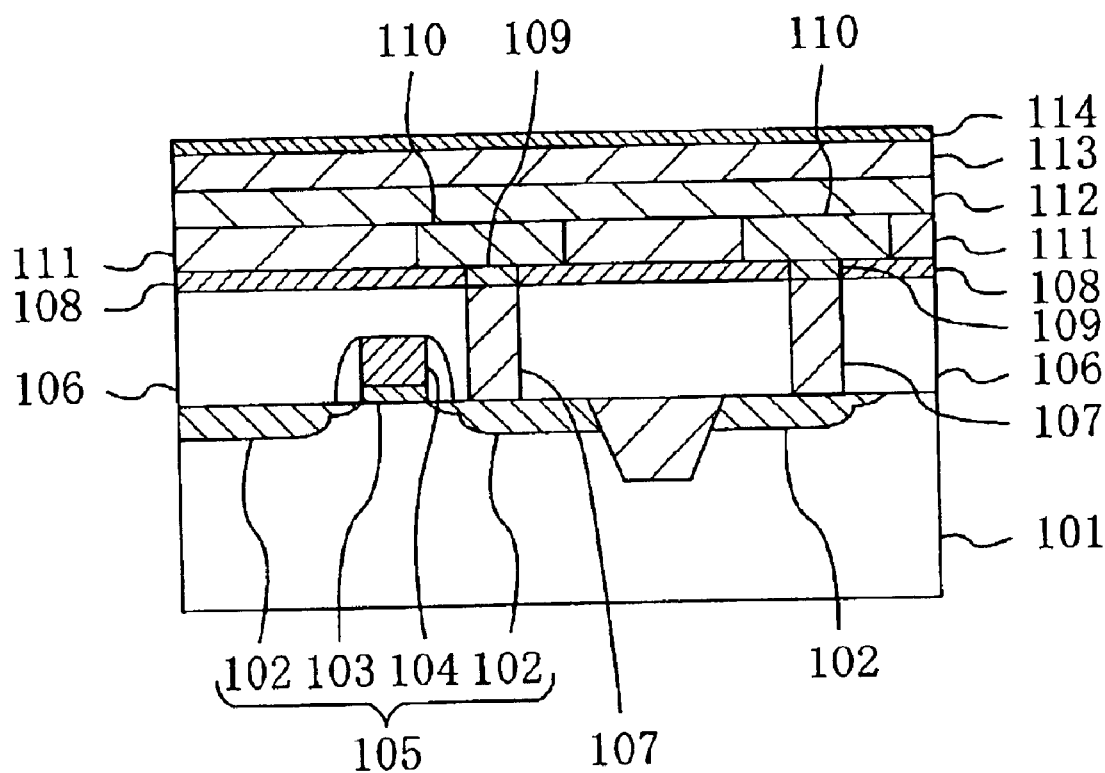
FIG. 15 is a cross-sectional view illustrating an important part of a conventional semiconductor memory device.
Figure 16A:
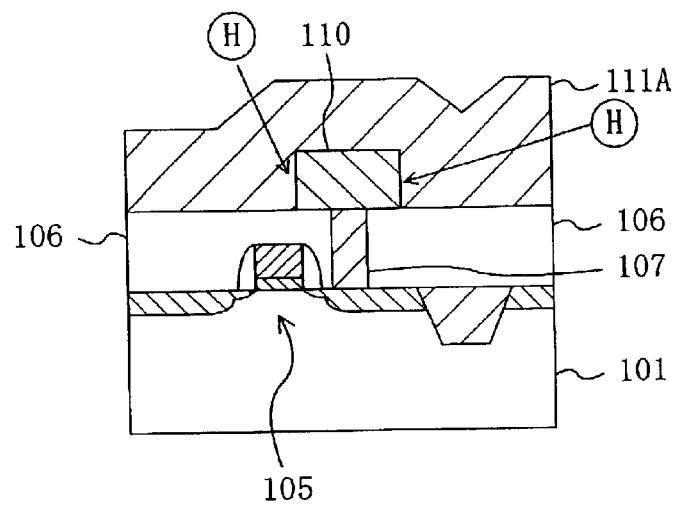
FIG. 16A and FIG. 16B are schematic cross-sectional views each illustrating how a problem occurs in a lower electrode of a capacitor in the conventional semiconductor memory device.
Figure 16B:
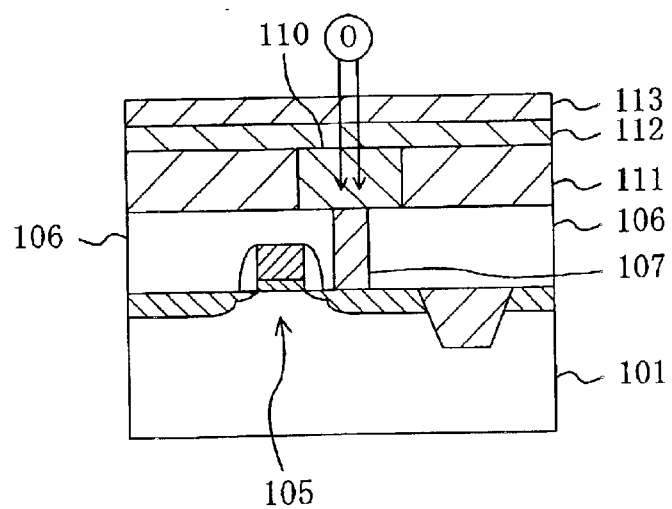
Figure 17:
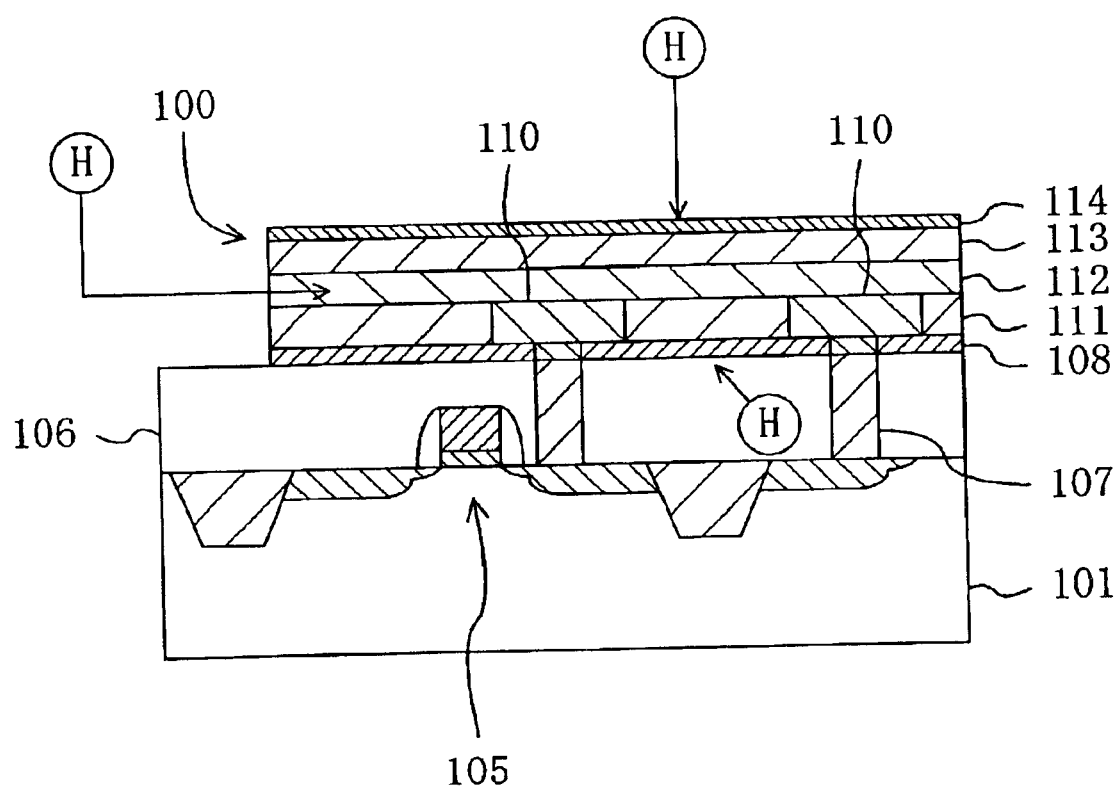
FIG. 17 is a schematic cross-sectional view illustrating how a problem occurs in a capacitor insulating film of the capacitor in the conventional semiconductor memory device.

Then, as illustrated in FIG. 14B, by using a CVD method or a sputtering method, the second insulating barrier layer 17, which is made of aluminum oxide, has a thickness of 5 nm to 100 nm, and prevents the diffusion of hydrogen, is deposited across the entire surface of the interlayer insulating film 13 so as to cover the upper surface and the side surface of the upper electrode 33, the side surface of the capacitor insulating film 32 and the buried insulating film 16, and the end surface of the first insulating barrier layer 45, which have been patterned into divisions respectively corresponding to the cell blocks 50. In this way, the second insulating barrier layer 17 is in contact with the end surface of the first insulating barrier layer 45 located under the buried insulating film 16 along the periphery of the cell block 50. Then, as illustrated in FIG. 12A, the deposited second insulating barrier layer 17 is patterned by using a dry etching method so that each division includes two cell blocks 50 that are adjacent to each other. Note however that the patterning on the second insulating barrier layer 17 may not need to be performed.

As a variation of the manufacturing method of the fourth embodiment, the first insulating barrier layer 45 may not be patterned in the step shown in FIG. 14A, i.e., the step of patterning the upper electrode 33, the capacitor insulating film 32, etc., into divisions respectively corresponding to the cell blocks 50, but the first insulating barrier layer 45 may be patterned successively with the second insulating barrier layer 17 in the subsequent step illustrated in FIG. 14B, as in the manufacturing method of the first embodiment.

Note that while strontium bismuth tantalum niobate (SrBi$_2$(Ta$_{1-x}$Nb$_x$)$_2$O$_9$) is used for the capacitor insulating film 32 in the first to fourth embodiments, the present invention is not limited thereto, as long as the material is a ferroelectric material having a bismuth layered perovskite structure. For example, lead zirconate titanate, barium strontium titanate, tantalum pentoxide, etc., may be used.

Moreover, while aluminum oxide (Al$_2$O$_3$) is used for the first insulating barrier layer 15, 15A, 45 in the first to fourth embodiments, titanium aluminum oxide (TiAlO) or tantalum aluminum oxide (TaAlO) may alternatively be used. In this way, these metal oxides, including aluminum oxide, can substantially completely prevent the diffusion of oxygen and hydrogen in a lateral direction from the buried insulating film 16 into the lower electrode 31. Note however that for the first insulating barrier layer 45 of the fourth embodiment, silicon nitride (Si$_3$N$_4$) or silicon oxynitride (SiON) is preferred for the ease of manufacturing process, as described above.

Similarly, for the second insulating barrier layer 17, titanium aluminum oxide (TiAlO) or tantalum aluminum oxide (TaAlO) may be used instead of aluminum oxide (Al$_2$O$_3$). In this way, it is possible to substantially completely prevent the diffusion of hydrogen into the capacitor insulating film 32 in the direction vertical or horizontal with respect to the substrate surface.

Moreover, while titanium aluminum nitride (TiAlN) is used as the first conductive barrier layer 31a of the lower electrode 31 in the first to fourth embodiments, it is preferred to use, instead of titanium aluminum nitride (TiAlN), one of titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl), or to use a layered film including TiAlN and at least two of the above-listed materials. In this way, during a high-temperature oxygen annealing process, which is performed for crystallization of a high-permittivity dielectric material or a ferroelectric material of the capacitor insulating film 32, it is possible to prevent oxygen from being diffused into the contact plug 14, while it is possible to prevent the diffusion of hydrogen from the lower electrode 31 into the capacitor insulating film 32.

Moreover, while iridium (Ir) is used for the second conductive barrier layer 31b of the lower electrode 31, and iridium dioxide (IrO$_2$) is used for the third conductive barrier layer 31c thereof, the present invention is not limited to this.

Specifically, the second and third conductive barrier layers 31b and 31c may be any of a single layer film made of iridium dioxide (IrO$_2$), a single layer film made of ruthenium dioxide (RuO$_2$), or a layered film including a lower layer made of ruthenium (Ru) and an upper layer made of ruthenium dioxide (RuO$_2$). Furthermore, the second and third conductive barrier layers 31b and 31c may alternatively be a layered film including at least two of the above-listed films, including a layered film made of iridium (Ir) and iridium dioxide (IrO$_2$). In this way, during a high-temperature oxygen annealing process, which is performed for crystallization of a high-permittivity dielectric material or a ferroelectric material of the capacitor insulating film 32, it is possible to prevent oxygen from being diffused into the contact plug 14, whereby the surface of the contact plug 14 is oxidized by the diffused oxygen, thus increasing the contact resistance.

Moreover, in the first to fourth embodiments, silicon oxide (SiO$_2$) or silicon nitride (Si$_3$N$_4$) is used for the buried insulating film 16 with which regions beside the lower electrode 31 are filled. In this way, the lower electrodes 31 that are adjacent to each other are electrically insulated from each other, and it is easy to perform the flattening process. Therefore, it is a desirable base layer on which the capacitor insulating film 32 is deposited.

What is claimed is:

1. A capacitor, comprising:
   a lower electrode;
   a capacitor insulating film made of a metal oxide and formed on the lower electrode; and
   an upper electrode formed on the capacitor insulating film, wherein:
      the lower electrode includes a conductive barrier layer that prevents diffusion of oxygen and hydrogen;
      a first insulating barrier layer that prevents diffusion of hydrogen is formed so as to be in contact with at least a side surface of the conductive barrier layer;
      a second insulating barrier layer that prevents diffusion of hydrogen is formed so as to cover a side surface and the entire upper surface of the upper electrode and a side surface of the capacitor insulating film; and
      the second insulating barrier layer covers the lower electrode and is in contact with the first insulating barrier layer.

2. The capacitor of claim 1, wherein the first insulating barrier layer also prevents diffusion of oxygen.

3. The capacitor of claim 1, wherein the conductive barrier layer includes a layered film made of a first conductive barrier layer that prevents diffusion of oxygen and hydrogen, and a second conductive barrier layer that prevents diffusion of oxygen.

4. The capacitor of claim 3, wherein the first conductive barrier layer includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl).

5. The capacitor of claim 3, wherein the second conductive barrier layer includes one of, or is a layered film including at least two of, iridium dioxide (IrO$_2$), a layered film including a lower layer made of iridium (Ir) and an upper layer made of iridium dioxide (IrO$_2$), ruthenium dioxide (RuO$_2$), and a layered film including a lower layer made of ruthenium (Ru) and an upper layer made of ruthenium dioxide (RuO$_2$).

6. The capacitor of claim 1, wherein the first insulating barrier layer and the second insulating barrier layer are made of aluminum oxide (Al$_2$O$_3$), titanium aluminum oxide (TiAlO), or tantalum aluminum oxide (TaAlO).

7. The capacitor of claim 1, further comprising a buried insulating film surrounding the lower electrode.

8. The capacitor of claim 7, wherein the buried insulating film is formed in a hydrogen-containing atmosphere.

9. The capacitor of claim 7, wherein the buried insulating film is made of silicon oxide (SiO$_2$) or silicon nitride (Si$_3$N$_4$).

10. A capacitor, comprising:
a lower electrode;
a capacitor insulating film made of a metal oxide and formed on the lower electrode; and
an upper electrode formed on the capacitor insulating film, wherein:
the lower electrode includes a conductive barrier layer that includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl);
a first insulating barrier layer including at least one of aluminum oxide (Al$_2$O$_3$), titanium aluminum oxide (TiAlO), and tantalum aluminum oxide (TaAlO), is formed so as to be in contact with at least a side surface of the conductive barrier layer;
a second insulating barrier layer including at least one of aluminum oxide (Al$_2$O$_3$), titanium aluminum oxide (TiAlO), and tantalum aluminum oxide (TaAlO), is formed so as to cover a side surface and the entire upper surface of the upper electrode and a side surface of the capacitor insulating film; and
the second insulating barrier layer covers the lower electrode and is in contact with the first insulating barrier layer.

11. A semiconductor memory device, comprising:
a transistor formed on a semiconductor substrate and including a source region and a drain region;
an interlayer insulating film formed on the semiconductor substrate so as to cover the transistor;
a contact plug formed in the interlayer insulating film so as to be electrically connected to the source region or the drain region of the transistor;
a lower electrode formed on the interlayer insulating film so as to be electrically connected to the contact plug;
a capacitor insulating film made of a metal oxide and formed on the lower electrode;
an upper electrode formed on the capacitor insulating film;
a first insulating barrier layer that prevents diffusion of hydrogen formed so as to be in contact with at least a side surface of the conductive barrier layer; and
a second insulating barrier layer that prevents diffusion of hydrogen formed so as to cover a side surface and the entire upper surface of the upper electrode and a side surface of the capacitor insulating film;
wherein the lower electrode includes a conductive barrier layer that prevents diffusion of oxygen and hydrogen, and
the second insulating barrier layer covers the lower electrode and is in contact with the first insulating barrier layer.

12. A semiconductor memory device, comprising:
a lower electrode formed on a semiconductor substrate, the lower electrode including a conductive barrier layer that prevents diffusion of hydrogen;
a capacitor insulating film made of a metal oxide and formed on the lower electrode; and
a memory cell array including an upper electrode formed on the capacitor insulating film, the upper electrode being provided for one or more blocks each including a plurality of lower electrodes,
wherein an insulating barrier layer that prevents diffusion of hydrogen is formed so as to cover an under surface, a side surface and the entire upper surface of one or more of the blocks.

13. The semiconductor memory device of claim 12, wherein in the block, the upper electrode is electrically connected to a second contact plug, which is connected to a source region or a drain region of a second transistor, via a conductive barrier film that prevents diffusion of hydrogen.

14. The semiconductor memory device of claim 12, wherein in the block, the upper electrode is electrically connected to a contact plug, which is connected to a source region or a drain region of a transistor, via the lower electrode.

15. A semiconductor memory device, comprising:
a lower electrode formed on a semiconductor substrate, the lower electrode including a conductive barrier layer that prevents diffusion of hydrogen;
a capacitor insulating film made of a metal oxide and formed on the lower electrode; and
a memory cell array including an upper electrode formed on the capacitor insulating film, the upper electrode being provided for one or more blocks each including a plurality of lower electrodes, wherein:
a first insulating barrier layer that prevents diffusion of hydrogen is formed so as to be in contact with the plurality of lower electrodes and to cover a bottom surface of the block;
a second insulating barrier layer that prevents diffusion of hydrogen is formed so as to cover an upper surface and a side surface of the upper electrode and a side surface of the capacitor insulating film, thereby covering an upper surface and a side surface of the block; and
the second insulating barrier layer is in contact with the first insulating barrier layer along a periphery of one or more of the blocks.

16. The semiconductor memory device of claim 15, wherein the conductive barrier layer includes one of, or is a layered film including at least two of, titanium aluminum nitride (TiAlN), titanium aluminum (TiAl), titanium silicon nitride (TiSiN), tantalum nitride (TaN), tantalum silicon nitride (TaSiN), tantalum aluminum nitride (TaAlN), and tantalum aluminum (TaAl).

17. The semiconductor memory device of claim 15, wherein the first insulating barrier layer or the second insulating barrier layer includes at least one of aluminum oxide ($Al_2O_3$), titanium aluminum oxide (TiAlO), and tantalum aluminum oxide (TaAlO).

18. The semiconductor memory device of claim 15, wherein the first insulating barrier layer is made of silicon nitride ($Si_3N_4$).

19. A semiconductor device comprising:

a plurality of capacitor portions formed in a row; and an upper electrode plug formed adjacent to one of the plurality of capacitor portions, wherein:

each of the plurality of capacitor portions includes, a first lower electrode having a first lower hydrogen barrier film, a capacitor insulating film formed on the first lower electrode, and a first upper electrode formed on the capacitor insulating film, the capacitor insulating film and the first upper electrode are commonly shared by the plurality of capacitor portions, the upper electrode plug includes, a second lower electrode having a second lower hydrogen barrier film, and a connecting portion that electrically connects the second lower electrode and a second upper electrode via an opening formed in the capacitor insulating film, and an upper hydrogen barrier film is formed covering a side surface and the entire upper surface of the plurality of capacitor portions.

* * * * *